(12) United States Patent
Bai et al.

(10) Patent No.: US 12,356,816 B2
(45) Date of Patent: Jul. 8, 2025

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Lu Bai, Beijing (CN); Yang Zhou, Beijing (CN); Yi Qu, Beijing (CN); Junxiu Dai, Beijing (CN); Song Liu, Beijing (CN); Tinghua Shang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/022,494

(22) PCT Filed: Apr. 29, 2022

(86) PCT No.: PCT/CN2022/090429
§ 371 (c)(1),
(2) Date: Feb. 21, 2023

(87) PCT Pub. No.: WO2023/206409
PCT Pub. Date: Nov. 2, 2023

(65) Prior Publication Data
US 2024/0268164 A1    Aug. 8, 2024

(51) Int. Cl.
*H01L 27/32*    (2006.01)
*G09G 3/3233*    (2016.01)
(Continued)

(52) U.S. Cl.
CPC ......... *H10K 59/131* (2023.02); *G09G 3/3233* (2013.01); *G11C 19/287* (2013.01);
(Continued)

(58) Field of Classification Search
None
See application file for complete search history.

(56) References Cited

U.S. PATENT DOCUMENTS

| 2014/0340625 A1 | 11/2014 | Hsu et al. |
| 2017/0139252 A1 | 5/2017 | Chen et al. |

(Continued)

FOREIGN PATENT DOCUMENTS

| CN | 103472607 A | 12/2013 |
| CN | 105140179 A | 12/2015 |

(Continued)

*Primary Examiner* — Carl Adams
(74) *Attorney, Agent, or Firm* — Stephen Yang; Ling Wu; Ling and Yang Intellectual

(57) ABSTRACT

Disclosed are a display substrate and a display apparatus, wherein the display substrate includes a display region and a non-display region which includes a rounded corner region; the display substrate includes a circuit structure layer including a pixel circuit and a control drive circuit; the circuit structure layer further includes a plurality of reset output lines and a plurality of reset transfer lines located in the non-display region and disposed on a side of the control drive circuit close to the display region, and an extension direction of the reset output line and an extension direction of the reset transfer line intersect; the reset transfer line is connected with the pixel circuit; an orthographic projection of at least one reset transfer line located in the rounded corner region on the base substrate is partially overlapped with orthographic projections of the plurality of reset output lines on the base substrate.

19 Claims, 28 Drawing Sheets

(51) Int. Cl.
*G11C 19/28* (2006.01)
*H10K 59/131* (2023.01)

(52) U.S. Cl.
CPC ........... *G09G 2300/0819* (2013.01); *G09G 2300/0842* (2013.01); *G09G 2310/0286* (2013.01); *G09G 2310/08* (2013.01); *G09G 2320/0209* (2013.01)

(56) References Cited

U.S. PATENT DOCUMENTS

| | | |
|---|---|---|
| 2017/0213852 A1 | 7/2017 | Li et al. |
| 2018/0033821 A1 | 2/2018 | Kim |
| 2019/0033647 A1 | 1/2019 | Yang et al. |
| 2019/0189232 A1 | 6/2019 | Wang |
| 2019/0206295 A1* | 7/2019 | Jeon ................. H10D 86/60 |
| 2020/0185428 A1 | 6/2020 | Um et al. |
| 2021/0074196 A1 | 3/2021 | Feng et al. |
| 2021/0356830 A1 | 11/2021 | Yoshida |
| 2022/0122547 A1 | 4/2022 | Yu |
| 2022/0199736 A1 | 6/2022 | Wang et al. |
| 2022/0310708 A1 | 9/2022 | Dai et al. |
| 2022/0320230 A1* | 10/2022 | Zhang ................. H10K 59/65 |

FOREIGN PATENT DOCUMENTS

| | | |
|---|---|---|
| CN | 109192137 A | 1/2019 |
| CN | 113157137 A | 7/2021 |
| CN | 113189806 A | 7/2021 |
| CN | 113241422 A | 8/2021 |
| CN | 113253504 A | 8/2021 |
| CN | 113257130 A | 8/2021 |
| CN | 113257205 A | 8/2021 |
| CN | 113325637 A | 8/2021 |
| CN | 113327963 A | 8/2021 |
| CN | 113362752 A | 9/2021 |
| CN | 113363298 A | 9/2021 |
| CN | 113376883 A | 9/2021 |
| CN | 113410275 A | 9/2021 |
| CN | 113410277 A | 9/2021 |
| CN | 113471225 A | 10/2021 |
| CN | 113906568 A | 1/2022 |
| CN | 114190108 A | 3/2022 |
| CN | 114207699 A | 3/2022 |
| TW | I567614 B | 1/2017 |

* cited by examiner

DISPLAY SUBSTRATE AND DISPLAY APPARATUS

CROSS-REFERENCE TO RELATED APPLICATION

The present application is a U.S. National Phase Entry of International Application No. PCT/CN2022/090429 having an international filing date of Apr. 29, 2022. The entire contents of the above-identified application are hereby incorporated by reference.

TECHNICAL FIELD

The present disclosure relates to, but is not limited to, the field of display technologies, and more particularly, to a display substrate and a display apparatus.

BACKGROUND

An Organic Light Emitting Diode (OLED for short) and a Quantum dot Light Emitting Diode (QLED for short) are active light emitting display devices and have advantages such as self-luminescence, a wide viewing angle, a high contrast ratio, low power consumption, an extremely high response speed, lightness and thinness, flexibility, and a low cost. With continuous development of display technologies, a flexible display apparatus (Flexible Display) in which an OLED or QLED is used as a light emitting element and signal control is performed by a Thin Film Transistor (TFT) has become a mainstream product in the field of display at present.

SUMMARY

The following is a summary of subject matters described herein in detail. The summary is not intended to limit the protection scope of claims.

In a first aspect, an embodiment of the present disclosure provides a display substrate including a display region and a non-display region, the display region includes at least one rounded corner, the non-display region includes a rounded corner region disposed on an outside of the rounded corner; the display substrate includes a base substrate and a circuit structure layer disposed on the base substrate, the circuit structure layer includes pixel circuits arranged in an array and located in the display region and a control drive circuit located in the non-display region, a pixel circuit includes a reset transistor, and the control drive circuit is configured to provide a drive signal to the reset transistor.

The circuit structure layer further includes a plurality of reset output lines and a plurality of reset transfer lines located in the non-display region and disposed on a side of the control drive circuit close to the display region, a reset output line is disposed in a different layer from a reset transfer line, and an extension direction of the reset output line and an extension direction of the reset transfer line intersect.

The reset output line is electrically connected with the control drive circuit and the reset transfer line, respectively, and the reset transfer line is connected with the pixel circuit.

An orthographic projection of at least one reset transfer line located in the rounded corner region on the base substrate is partially overlapped with an orthographic projection of the plurality of reset output lines on the base substrate.

In some possible implementation modes, the circuit structure layer further includes a reset connection line located in the non-display region and disposed on a side of the control drive circuit close to the display region, the reset connection line is disposed in a different layer from the reset output line, an extension direction of the reset connection line and an extension direction of the reset output line intersect; the pixel circuits arranged in the array include a plurality of reset signal lines.

The reset connection line is electrically connected with the reset transfer line and a reset signal line, respectively.

At least one reset connection line located in the rounded corner region is partially overlapped with orthographic projections of the plurality of reset output lines on the base substrate.

In some possible implementation modes, the pixel circuit further includes a writing transistor, and the control drive circuit is further configured to provide a drive signal to the writing transistor.

The circuit structure layer further includes a plurality of control output lines located in the non-display region and disposed on a side of the control drive circuit close to the display region, a control output line is disposed in a different layer from the reset output line, and an extension direction of the control output line and an extension direction of the reset output line intersect.

The control output line is connected with the control drive circuit and the pixel circuit respectively, and an orthographic projection of the control output line on the base substrate is partially overlapped with the orthographic projections of the plurality of reset output lines on the base substrate.

In some possible implementation modes, the circuit structure layer further includes a control connection line located in the non-display region and disposed on a side of the control drive circuit close to the display region, the control connection line is disposed in a different layer from the reset output line, an extension direction of the control connection line and an extension direction of the reset output line intersect; the pixel circuits arranged in the array include a plurality of control signal lines; a control electrode of the writing transistor is electrically connected with a control signal line.

The control connection line is electrically connected with the control output line and the control signal line, respectively.

At least one control connection line located in the rounded corner region is partially overlapped with the orthographic projections of the plurality of reset output lines on the base substrate.

In some possible implementation modes, the control drive circuit includes a plurality of cascaded control shift registers, and a control shift register includes an output terminal.

An output terminal of an i-th stage control shift register is electrically connected with an i-th reset output line, $1 \leq i \leq M$, an output terminal of a j-th stage control shift register is electrically connected with a (j-S)-th control output line, $S+1 \leq j \leq M+S$, M is a total number of rows of pixel circuits, $S \geq 1$.

A reset output line and a control output line that are connected with an output terminal of a same control shift register are interconnected, and an orthographic projection of the reset output line on the base substrate is partially overlapped with an orthographic projection of the control output line the base substrate.

In some possible implementation modes, the circuit structure layer further includes a light emitting drive circuit located in the non-display region, the light emitting drive circuit is located on a side of the control drive circuit away from the display region, the pixel circuit includes a light emitting transistor, the light emitting drive circuit is configured to provide a drive signal to the light emitting transistor.

The circuit structure layer further includes a plurality of light emitting output lines located in the non-display region and disposed on a side of the control drive circuit close to the display region, a light emitting output line is disposed in a different layer from the reset output line, an extension direction of the light emitting output line and an extension direction of the reset output line intersect.

The light emitting output line is connected with the light emitting drive circuit and the pixel circuit respectively, and an orthographic projection of the light emitting output line on the base substrate is partially overlapped with the orthographic projections of the plurality of reset output lines on the base substrate.

In some possible implementation modes, the circuit structure layer further includes a light emitting connection line located in the non-display region and disposed on a side of the control drive circuit close to the display region, the light emitting connection line is disposed in a different layer from the reset output line, an extension direction of the light emitting connection line and an extension direction of the reset output line intersect, the pixel circuits arranged in the array include a plurality of light emitting signal lines.

The light emitting connection line is electrically connected with the light emitting output line and a light emitting signal line, respectively.

At least one light emitting connection line located in the rounded corner region is partially overlapped with the orthographic projections of the plurality of reset output lines on the base substrate.

In some possible implementation modes, the light emitting drive circuit includes a plurality of cascaded light emitting shift registers, and a light emitting shift register includes an output terminal.

An output terminal of at least one stage light emitting shift register is electrically connected with a plurality of light emitting output lines.

In some possible implementation modes, when a light emitting shift register is electrically connected with at least two light emitting output lines, the circuit structure layer further includes a light emitting connection part located in the non-display region and disposed on a side of the control drive circuit close to the display region, the light emitting connection part is disposed in a different layer from a light emitting output line, and an extension direction of the light emitting connection part and an extension direction of the light emitting output line intersect.

At least two light emitting output lines connected with a same light emitting shift register are electrically connected through the light connection part, and the light connection part is located on a side of the plurality of reset output lines away from the display region.

In some possible implementation modes, the circuit structure layer further includes a scan drive circuit located in the non-display region, the scan drive circuit is located between the control drive circuit and the light emitting drive circuit, the pixel circuit includes a compensation transistor, and the scan drive circuit is configured to provide a drive signal to the compensation transistor.

The circuit structure layer further includes a plurality of scan output lines located in the non-display region and disposed on a side of the control drive circuit close to the display region, a scan output line is disposed in a different layer from the reset output line, and an extension direction of the scan output line and an extension direction of the reset output line intersect.

The scan output line is connected with the scan drive circuit and the pixel circuit respectively, and an orthographic projection of the scan output line on the base substrate is partially overlapped with the orthographic projections of the plurality of reset output lines on the base substrate.

In some possible implementation modes, the circuit structure layer further includes a scan connection line located in the non-display region and disposed on a side of the control drive circuit close to the display region, the scan connection line is disposed in a different layer from the reset output line, an extension direction of the scan connection line and an extension direction of the reset output line intersect, and the pixel circuits arranged in the array include a plurality of scan signal lines.

The scan connection line is electrically connected with the scan output line and a scan signal line, respectively.

At least one scan connection line located in the rounded corner region is partially overlapped with the orthographic projections of the plurality of reset output lines on the base substrate.

In some possible implementation modes, the scan drive circuit includes a plurality of cascaded scan shift registers, and a scan shift register includes an output terminal.

An output terminal of at least one stage scan shift register is electrically connected with a plurality of scan output lines.

In some possible implementation modes, when a scan shift register is electrically connected with at least two scan output lines, the circuit structure layer further includes a scan connection part located in the non-display region and disposed on a side of the control drive circuit close to the display region, the scan connection part is disposed in a different layer from a scan output line, and an extension direction of the scan connection part and an extension direction of the scan output line intersect.

At least two scan output lines connected with a same scan shift register are electrically connected through the scan connection part, and the scan connection part is located on a side of the plurality of reset output lines away from the display region.

In some possible implementation modes, an (S+1)-th stage control shift register to an (M+S)-th stage control shift register are located between the light emitting drive circuit and the scan drive circuit.

Multi-stage control shift registers located in the rounded corner region are arranged along a boundary of the rounded corner.

Multi-stage light emitting shift registers located in the rounded corner region are arranged along the boundary of the rounded corner.

Multi-stage scan shift registers located in the rounded corner region are arranged along the boundary of the rounded corner.

In some possible implementation modes, the circuit structure layer further includes a plurality of first initial output lines located in the non-display region and disposed on a side of the control drive circuit close to the display region, a first initial output line is disposed in a different layer from the reset output line, an extension direction of the first initial output line and an extension direction of the reset output line intersect, and the pixel circuits arranged in the array include a plurality of first initial signal lines and a plurality of second initial signal lines.

The first initial output line is electrically connected with one signal line of a first initial signal line and a second initial signal line of a pixel circuit, and an orthographic projection of the first initial output line on the base substrate is partially overlapped with the orthographic projections of the plurality of reset output lines on the base substrate.

In some possible implementation modes, the circuit structure layer further includes a plurality of first initial connection lines located in the non-display region and disposed on a side of the control drive circuit close to the display region, a first initial connection line is disposed in a different layer from the reset output line, and an extension direction of the first initial connection line and an extension direction of the reset output line intersect.

The first initial output line is electrically connected with one signal line of the first initial signal line and the second initial signal line of the pixel circuit through the first initial connection line.

An orthographic projection of the first initial connection line located in the rounded corner region on the base substrate is partially overlapped with the orthographic projections of the plurality of reset output lines on the base substrate.

In some possible implementation modes, the circuit structure layer further includes a first initial power supply line located in the non-display region and disposed on a side of the control drive circuit close to the display region, the first initial power supply line is disposed in a different layer from the reset output line, and an extension direction of the first initial power supply line and an extension direction of the reset output line are parallel.

The first initial power supply line is electrically connected with the plurality of first initial output lines, and an orthographic projection of the first initial power supply line on the base substrate is at least partially overlapped with the orthographic projections of the plurality of reset output lines on the base substrate.

In some possible implementation modes, the circuit structure layer further includes a plurality of second initial connection lines located in the non-display region and disposed on a side of the control drive circuit close to the display region, a second initial connection line is disposed in a different layer from the reset output line, an extension direction of the second initial connection line and an extension direction of the reset output line intersect, and an extension direction of the first initial connection line and an extension direction of the second initial connection line are parallel.

The second initial connection line is electrically connected with the other signal line of the first initial signal line and the second initial signal line of the pixel circuit, and an orthographic projection of the second initial connection line on the base substrate is partially overlapped with the orthographic projections of the plurality of reset output lines on the base substrate.

In some possible implementation modes, the circuit structure layer further includes a second initial power supply line located in the non-display region and disposed on a side of the control drive circuit close to the display region, the second initial power supply line is disposed in a different layer from a reset output line and is disposed in a same layer as the second initial connection line, an extension direction of the first initial power supply line and an extension direction of the second initial power supply line are parallel, and the second initial power supply line is located on a side of the first initial power supply line close to the display region.

The second initial power supply line is electrically connected with the plurality of second initial connection lines, and an orthographic projection of the second initial power supply line on the base substrate is at least partially overlapped with the orthographic projections of the plurality of reset output lines on the base substrate.

In some possible implementation modes, the circuit structure layer includes a semiconductor layer, a first insulation layer, a first conductive layer, a second insulation layer, a second conductive layer, a third insulation layer, a third conductive layer, a fourth insulation layer, a fourth conductive layer, a fifth insulation layer, and a fifth conductive layer stacked sequentially on the base substrate.

The first conductive layer includes a reset signal line, a light emitting signal line, a scan signal line, and a control signal line.

The second conductive layer includes a first initial signal line, a second initial signal line, and a scan connection part.

The third conductive layer includes a light emitting connection part.

The fourth conductive layer includes a reset transfer line, a first initial output line, a light emitting output line, a scan output line, and a control output line.

The fifth conductive layer includes a reset connection line, a first initial connection line, a light emitting connection line, a scan connection line, a control connection line, a second initial connection line, a first initial power supply line, and a second initial power supply line.

In some possible implementation modes, the reset output line is located in the first conductive layer or the second conductive layer.

In a second aspect, the present disclosure also provides a display apparatus, including the above display substrate.

Other aspects may be understood upon reading and understanding drawings and detailed description.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure, but do not constitute limitations on the technical solutions of the present disclosure. Shapes and sizes of various components in the drawings do not reflect actual scales, but are only intended to schematically illustrate contents of the present disclosure.

DETAILED DESCRIPTION

Figure 1:
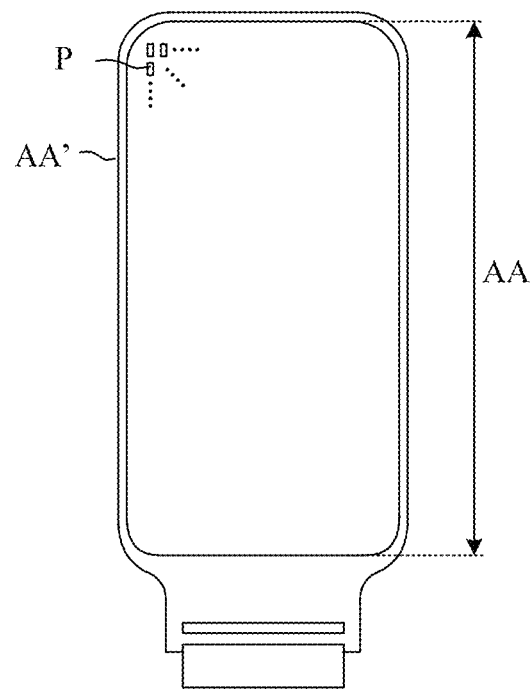
FIG. 1 is a schematic diagram of a structure of a display substrate.

To make objectives, technical solutions, and advantages of the present disclosure clearer, the embodiments of the present disclosure will be described in detail with reference to the accompanying drawings. It is to be noted that implementation modes may be implemented in a plurality of different forms. Those of ordinary skills in the art may easily understand such a fact that modes and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other without conflict. In order to keep following description of the embodiments of the present disclosure clear and concise, detailed descriptions about part of known functions and known components are omitted in the present disclosure. The drawings of the embodiments of the present disclosure only involve structures involved in the embodiments of the present disclosure, and other structures may refer to conventional designs.

A scale of the drawings in the present disclosure may be used as a reference in an actual process, but it is not limited thereto. For example, a width-length ratio of a channel, a thickness and a pitch of each film layer, and a width and a pitch of each signal line may be adjusted according to actual needs. A quantity of pixels in a display substrate and a quantity of sub-pixels in each pixel are not limited to numbers shown in the drawings. The drawings described in the present disclosure are schematic structural diagrams only, and one mode of the present disclosure is not limited to shapes, numerical values, or the like shown in the drawings.

In the drawings, a size of each constituent element, a thickness of a layer, or a region is exaggerated sometimes for clarity. Therefore, one mode of the present disclosure is not necessarily limited to the size, and shapes and sizes of various components in the drawings do not reflect actual scales. In addition, the drawings schematically illustrate ideal examples, and one mode of the present disclosure is not limited to shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating orientations or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two elements. Those of ordinary skill in the art may understand specific meanings of these terms in the present disclosure according to specific situations.

In the specification, a transistor refers to an element which includes at least three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, a first electrode may be a source electrode, and a second electrode may be a drain electrode. In a case that transistors with opposite polarities are used or a case that a direction of a current is changed during operation of a circuit, or the like, functions of the "source electrode" and the "drain electrode" are sometimes interchangeable. Therefore, the "source electrode" and the "drain electrode" are interchangeable in the specification.

In the specification, an "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switching elements such as transistors, resistors, inductors, capacitors, and other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

In this specification, "being disposed in a same layer" is referred to a structure formed by patterning two (or more than two) structures through a same patterning process, and their materials may be the same or different. For example, materials of precursors for forming a plurality of structures disposed in a same layer are the same, and formed materials finally may be the same or different.

A triangle, rectangle, trapezoid, pentagon, or hexagon, etc. in this specification is not strictly defined, and it may be an approximate triangle, rectangle, trapezoid, pentagon, or hexagon, etc. There may be some small deformation caused by tolerance, and there may be a chamfer, an arc edge, and deformation, etc.

In the present disclosure, "about" refers to that a boundary is defined not so strictly and numerical values within process and measurement error ranges are allowed.

A Low Temperature Poly-Silicon (LTPS for short) technology is used in a display substrate. The LTPS technology has advantages such as a high resolution, a high response speed, high brightness, and a high aperture ratio. Although it is welcomed by the market, the LTPS technology also has some defects, such as a relatively high production cost and relatively large power consumption. At this time, a technology solution of Low Temperature Polycrystalline Oxide (LTPO for short) came into being. Compared with the LTPS technology, in the LTPO technology, a leakage current is smaller, pixel point response is faster, and an additional layer of an oxide is added to a display substrate, which reduces energy consumption required for exciting pixel points, thus reducing power consumption during screen display. However, compared to a display product using the LTPS technology, for a display product using the LTPO technology, a set of drive circuits needs to be added to control metal oxide transistors in the display product, which makes the display product using the LTPO technology unable to achieve a narrow bezel.

Figure 2:
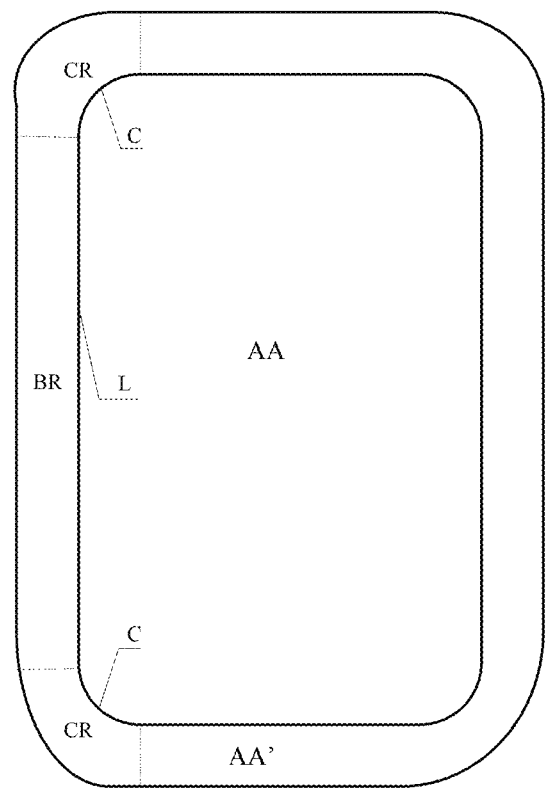
FIG. 2 is a schematic diagram of region division of a display substrate.
Figure 3:
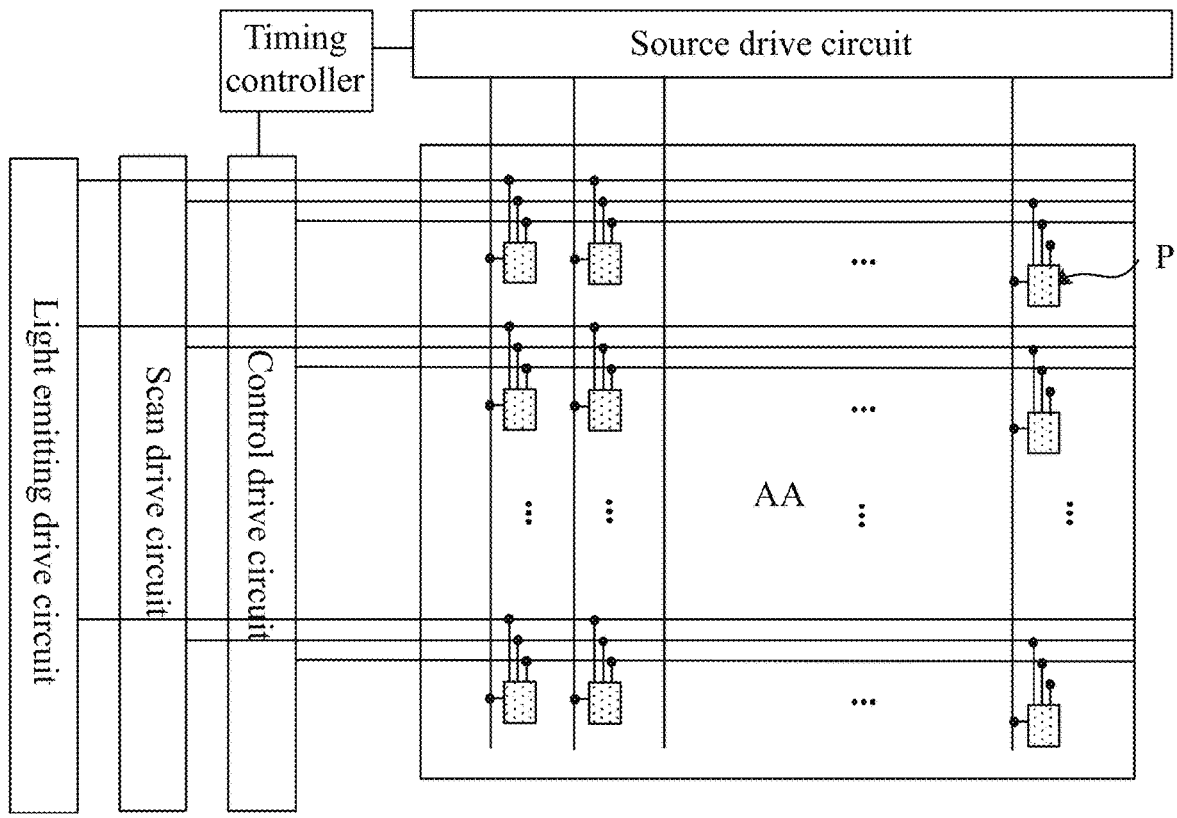
FIG. 3 is a schematic diagram of a structure of another display substrate.
Figure 4:
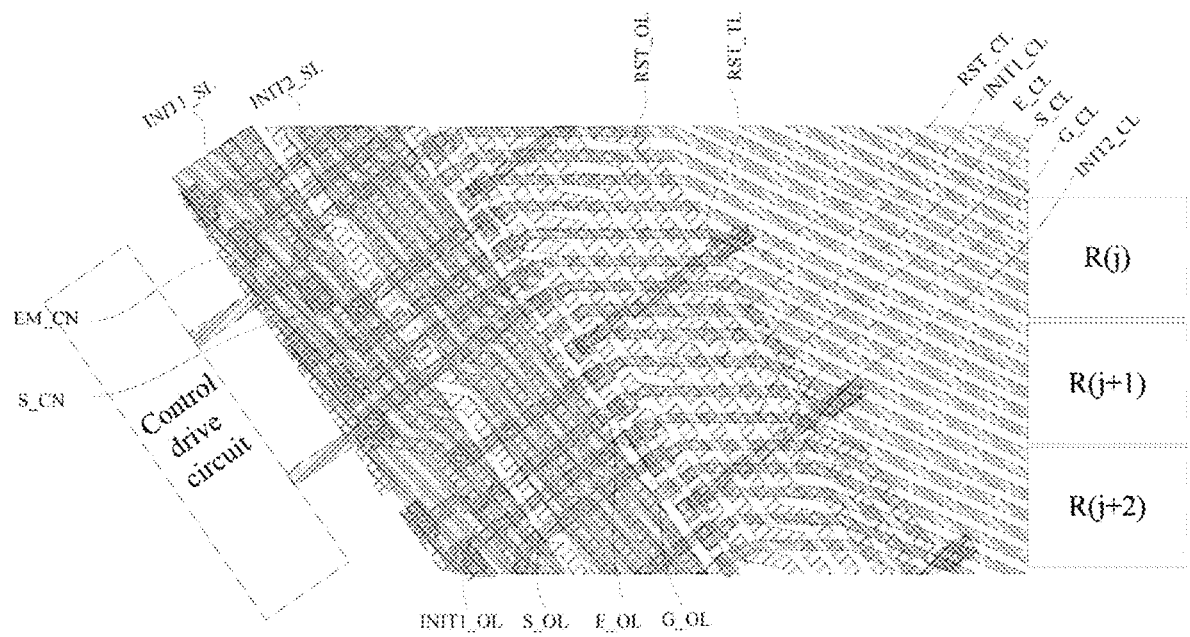
FIG. 4 is a schematic diagram of a structure of a rounded corner region in a display substrate according to an embodiment of the present disclosure.
Figure 5:
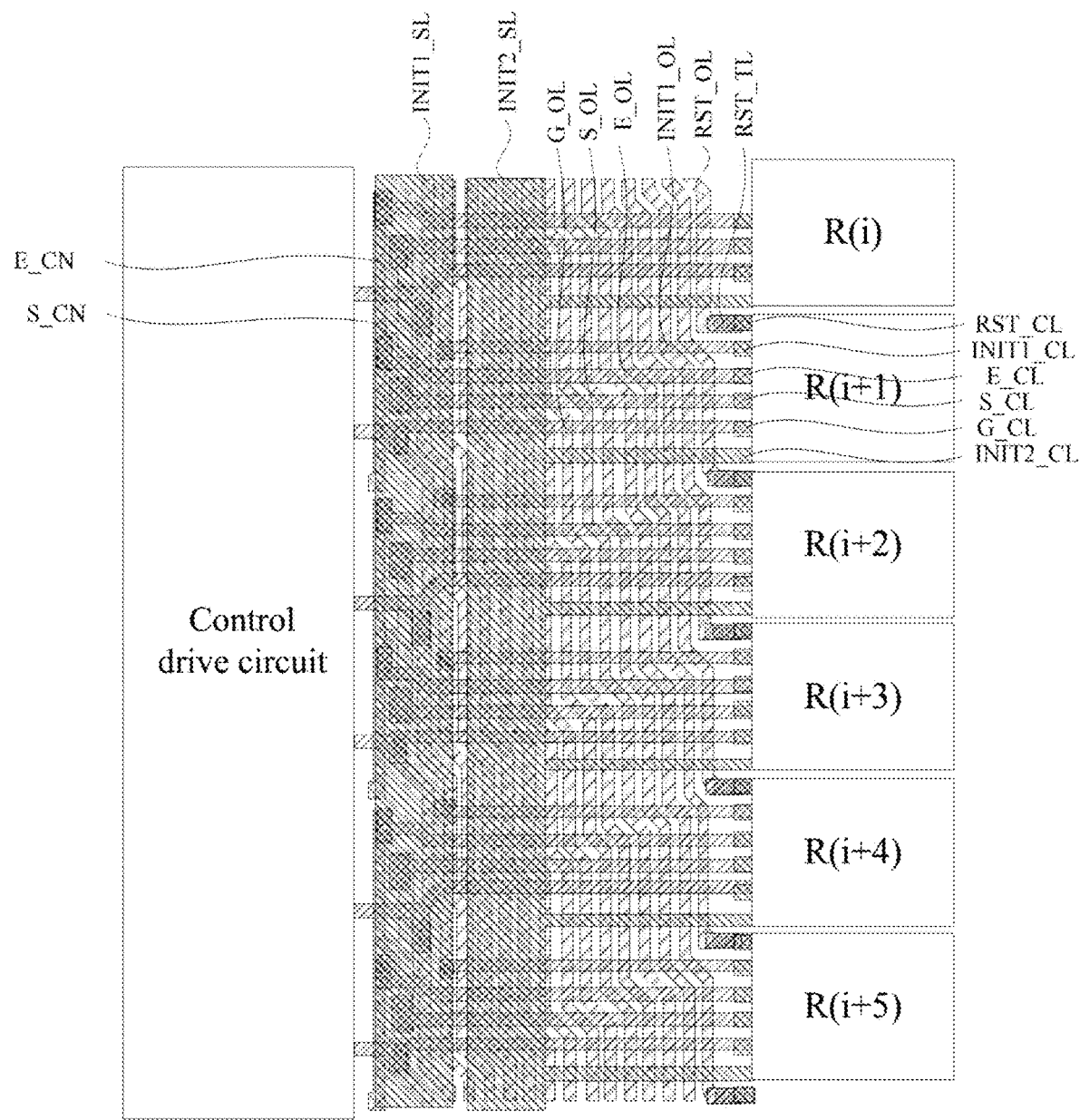
FIG. 5 is a schematic diagram of a structure of a bezel region in a display substrate according to an embodiment of the present disclosure.

FIG. 1 is a schematic diagram of a structure of a display substrate, FIG. 2 is a schematic diagram of region division of a display substrate, FIG. 3 is a schematic diagram of a structure of another display substrate, FIG. 4 is a schematic diagram of a structure of a rounded corner region in a display substrate according to an embodiment of the present disclosure, and FIG. 5 is a schematic diagram of a structure of a bezel region in a display substrate according to an embodiment of the present disclosure. As shown in FIGS. 1 to 3, a display substrate according to an embodiment of the present disclosure may include a display region AA and a non-display region AA', the display region AA includes at least one rounded corner C, the non-display region AA' includes a rounded corner region CR located on an outside of the rounded corner; the display substrate includes a base substrate and a circuit structure layer disposed on the base substrate, the circuit structure layer includes pixel circuits P arranged in an array and located in the display region AA and a control drive circuit located in the non-display region AA', a pixel circuit includes a reset transistor, and the control drive circuit is configured to provide a drive signal to the reset transistor.

As shown in FIG. 2, the display region AA further includes a straight-line bezel L, and the non-display region includes a bezel region BR located on an outside of the straight-line bezel.

In the present disclosure, as shown in FIGS. 4 and 5, the circuit structure layer further includes a plurality of reset output lines RST_OL and a plurality of reset transfer lines RST_TL located in the non-display region and disposed on a side of the control drive circuit GateP Gate Driver on Array (GOA) close to the display region, a reset output line RST_OL is disposed in a different layer from a reset transfer line RST_TL, and an extension direction of the reset output line RST_OL and an extension direction of the reset transfer line RST_TL intersect. R(i) in FIG. 4 and FIG. 5 refers to a pixel circuit of an i-th row.

In the present disclosure, a reset output line RST_OL is connected with the control drive circuit and a reset transfer line RST_TL, respectively, and the reset transfer line RST_TL is connected with a pixel circuit. Herein, an orthographic projection of at least one reset transfer line RST_TL located in the rounded corner region CR on the base substrate is partially overlapped with orthographic projections of the plurality of reset output lines RST_OL on the base substrate.

In an exemplary embodiment, the base substrate may be a rigid base substrate or a flexible base substrate, wherein the rigid base substrate may be, but is not limited to, one or more of glass and metal foil, the flexible base substrate may be, but is not limited to, one or more of polyethylene glycol terephthalate, ethylene terephthalate, polyether ether ketone, polystyrene, polycarbonate, polyarylate, polyarylester, polyimide, polyvinyl chloride, polyethylene, and textile fibers.

In an exemplary embodiment, as shown in FIGS. 1 and 2, a shape of a boundary of the display region may be a rounded rectangle, which is not limited in present disclosure. The display substrate according to the present disclosure may achieve a function of bending four sides at a large angle, improving a wrinkling problem of module attaching, and improving a product yield.

In an exemplary embodiment, the display substrate may further include a light emitting structure layer disposed on a side of the circuit structure layer away from the base substrate. The light emitting structure layer includes light emitting elements arranged in an array and located in the display region.

In an exemplary embodiment, a light emitting element may be an Organic Light Emitting Diode (OLED) or a Quantum dot Light Emitting Diode (QLED). Among them, the OLED may include a first electrode (anode), an organic emitting layer, and a second electrode (cathode) that are stacked.

In an exemplary embodiment, the display substrate may further include another film layer, such as a post spacer, which is not limited in the present disclosure.

In an exemplary embodiment, the display region includes pixel units arranged in an array, at least one pixel unit includes at least three sub-pixels, and at least one sub-pixel includes a pixel circuit and a light emitting element. The pixel circuit located in a same sub-pixel is electrically connected with the light emitting element, and is configured to drive the light emitting element to emit light.

In an exemplary embodiment, a pixel unit may include a Red (R) sub-pixel, a Green (G) sub-pixel, and a Blue (B) sub-pixel, or may include a red sub-pixel, a green sub-pixel, a blue sub-pixel, and a white sub-pixel, which is not limited in the present disclosure.

In an exemplary embodiment, a shape of a sub-pixel in a pixel unit may be a rectangle, a rhombus, a pentagon, or a hexagon. When the pixel unit includes three sub-pixels, the three sub-pixels may be arranged side by side horizontally, side by side vertically, or in a manner like a Chinese character "品", and when the pixel unit includes four sub-pixels, the four sub-pixels may be arranged side by side horizontally, side by side vertically, or in a manner to form a square, which is not limited in the present disclosure.

In an exemplary embodiment, the display substrate may be an LTPO display substrate or an LTPS display substrate.

In an exemplary embodiment, the pixel circuits arranged in an array include a plurality of data signal lines, a plurality of reset signal lines, a plurality of control signal lines, a plurality of scan signal lines, a plurality of light emitting signal lines, a plurality of first initial signal lines, and a plurality of second initial signal lines.

In an exemplary embodiment, a data signal line extends along a first direction and the plurality of data signal lines are arranged along a second direction. A reset signal line extends along the second direction, and the plurality of reset signal lines are arranged along the first direction. A control signal line extends along the second direction, and the plurality of control signal lines are arranged along the first direction. A scan signal line extends along the second direction, and the plurality of scan signal lines are arranged along the first direction. A light emitting signal line extends along the second direction, and the plurality of light emitting signal lines are arranged along the first direction. A first initial signal line extends along the second direction and the plurality of first initial signal lines are arranged along the first direction. A second initial signal line extends along the second direction and the plurality of second initial signal lines are arranged along the first direction.

Figure 6A:
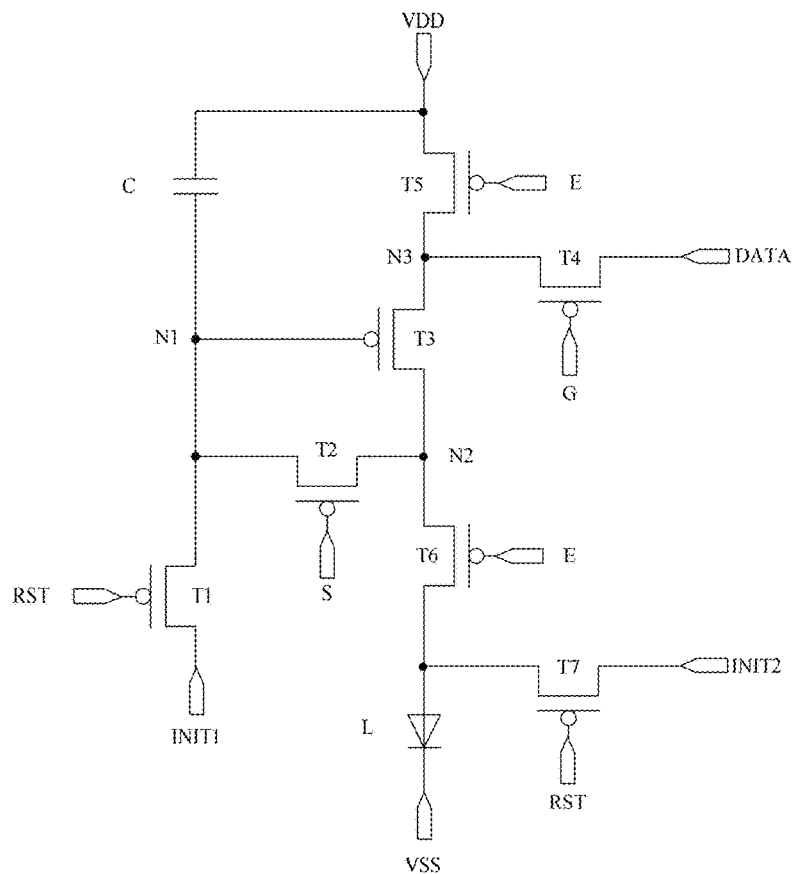
FIG. 6A is a schematic diagram of an equivalent circuit of a pixel circuit.

In an exemplary embodiment, FIG. 6A is a schematic diagram of an equivalent circuit of a pixel circuit. As shown in FIG. 6A, the pixel circuit may include seven transistors (a first transistor T1 to a seventh transistor T7), one capacitor C, and nine signal lines (a data signal line DATA, a control signal line G, a scan signal line S, a reset signal line RST, a light emitting signal line E, a first initial signal line INIT1, a second initial signal line INIT2, a first power supply line VDD, and a second power supply line (VSS).

In an exemplary embodiment, a first electrode plate of the capacitor C is connected with the first power supply line VDD, and a second electrode plate of the capacitor C is connected with a first node N1. A control electrode of the first transistor T1 is connected with the reset signal line RST, a first electrode of the first transistor T1 is connected with the first initial signal line INIT1, and a second electrode of the first transistor is connected with the first node N1; a control electrode of the second transistor T2 is connected with the scan signal line S, a first electrode of the second transistor T2 is connected with the first node N1, and a second electrode of the second transistor T2 is connected with a second node N2. A control electrode of the third transistor T3 is connected with the first node N1, a first electrode of the third transistor T3 is connected with the second node N2, and a second electrode of the third transistor T3 is connected with a third node N3. A control electrode of the fourth transistor T4 is connected with the control signal line G, a first electrode of the fourth transistor T4 is connected with the data signal line DATA, and a second electrode of the fourth transistor T4 is connected with the third node N3. A control electrode of the fifth transistor T5 is connected with the light emitting signal line E, a first electrode of the fifth transistor T5 is connected with the first power supply line VDD, and a second electrode of the fifth transistor T5 is connected with the third node N3; a control electrode of the sixth transistor T6 is connected with the light emitting signal line E, a first electrode of the sixth transistor T6 is connected with the second node N2, and a second electrode of the sixth transistor T6 is connected with a first electrode of a light emitting element. A control electrode of the seventh transistor T7 is connected with the control signal line G, a first electrode of the seventh transistor T7 is connected with the second initial signal line INIT2, a second electrode of the seventh transistor T7 is connected with a first electrode of a light emitting element L, and a second electrode of the light emitting element is connected with the second power supply line VSS.

In an exemplary embodiment, the first transistor T1 and the seventh transistor T7 may be referred to as reset transistors, and when an effective level signal is input to the reset signal line RST, the first transistor T1 transmits an initialization voltage to the first node N1 to initialize a charge amount of the first node N1, and the seventh transistor T7 transmits an initialization voltage to the first electrode of the light emitting element L to initialize a charge amount of the first electrode of the light emitting element L.

In an exemplary embodiment, the third transistor T3 may be referred to as a drive transistor, and the third transistor T3 determines a drive current which flows between the first power supply line VDD and the second power supply line VSS according to a potential difference between the control electrode and the first electrode.

In an exemplary embodiment, the fourth transistor T4 may be referred to as a writing transistor, etc., and when an effective level signal is input to the control signal line G, the fourth transistor T4 enables a data voltage of the data signal line DATA to be input to the pixel circuit.

In an exemplary embodiment, the fifth transistor T5 and the sixth transistor T6 may be referred to as light emitting transistors. When an effective level signal is input to the light emitting signal line E, the fifth transistor T5 and the sixth transistor T6 enables the light emitting element L to emit light by forming a drive current path between the first power supply line VDD and the second power supply line VSS.

In an exemplary embodiment, the first power supply line VDD continuously provides a high-level signal, and the second power supply line VSS continuously provides a low-level signal.

In an exemplary embodiment, the second transistor T2 is a metal oxide transistor and is an N-type transistor, and the first transistor T1 and the third transistor T3 to the seventh transistor T7 are low temperature poly-silicon transistors and are P-type transistors. An oxide transistor may reduce a leakage current and improve performance of the pixel circuit, and may reduce power consumption of the pixel circuit.

Figure 6B:
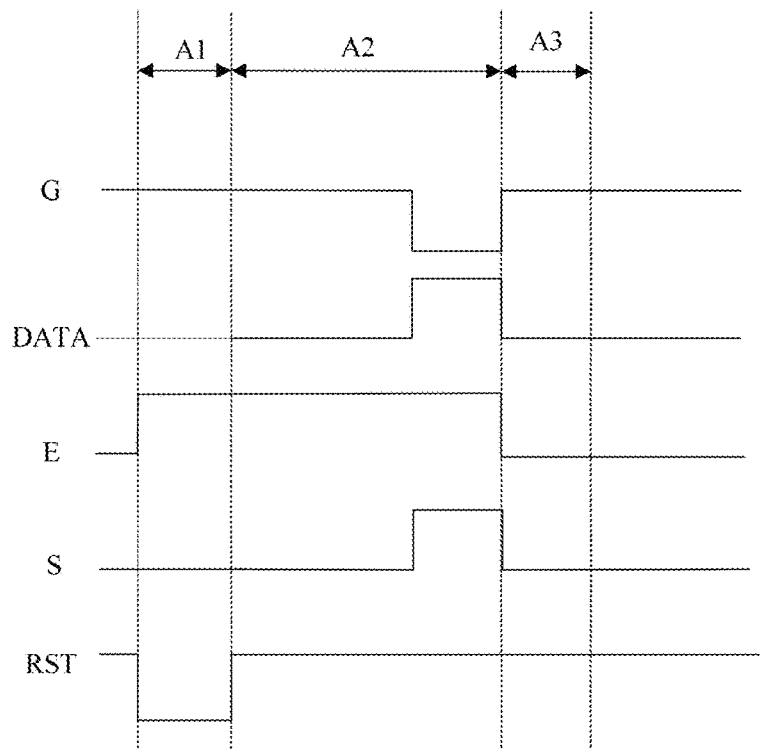
FIG. 6B is a working timing diagram of a pixel circuit.

FIG. 6B is a working timing diagram of a pixel circuit. A pixel circuit according to an exemplary embodiment is illustrated below through a working process of the pixel circuit illustrated in FIG. 6B. The working process of the pixel circuit may include following stages.

In a first stage A1, which is called a reset stage, signals of the control signal line G and the light emitting signal line E are high-level signals, and signals of the reset signal line RST and the scan signal line S are low-level signals. A signal of the reset signal line RST is a low-level signal, the first transistor T1 is turned on, a signal of the first initial signal line INIT1 is provided to the first node N1, the capacitor C is initialized, an original data voltage in the capacitor C is cleared, the seventh transistor T7 is turned on, an initial voltage of the second initial signal line INIT2 is provided to the first electrode of the light emitting element L, the first electrode of the light emitting element L is initialized (reset), and a pre-stored voltage in it is cleared to complete initialization. The signals of the control signal line G and light emitting signal line E are the high-level signals, a signal of the scan signal line S is a low-level signal, the second transistor T2, the fourth transistor T4, the fifth transistor T5, and the sixth transistor T6 are turned off, and the light emitting element L does not emit light in this stage.

In a second phase A2, which is called a data writing phase or a threshold compensation phase, a signal of the control signal line G is a low-level signal, signals of the reset signal line RST, the light emitting signal line E, and the scan signal line S are high-level signals, and the data signal line DATA outputs a data voltage. In this stage, since a signal of the first node N1 is a low-level signal, the third transistor T3 is turned on. The signal of the control signal line G is the low-level signal, the fourth transistor T4 is turned on, a signal of the scan signal line S is a high-level signal, and the second transistor T2 is turned on. The second transistor T2 and the fourth transistor T4 are turned on so that the data voltage output from the data signal line DATA is provided to the first node N1 through the third node N3, the turned-on third transistor T3, the second node N2, and the turned-on second transistor T2, and a difference between the data voltage output from the data signal line DATA and a threshold voltage of the third transistor T3 is charged to the capacitor C until a voltage of the first node N1 is Vd-|Vth|, wherein Vd is the data voltage output from the data signal line DATA and Vth is the threshold voltage of the third transistor T3. A signal of the reset signal line RST is a high-level signal, and the first transistor T1 and the seventh transistor T7 are turned off. A signal of the light emitting signal line E is a high-level signal, and the fifth transistor T5 and the sixth transistor T6 are turned off.

In a third stage A3, which is called a light emitting stage, signals of the scan signal line S and the light emitting signal line E are low-level signals, and signals of the reset signal line RST and the control signal line G are high-level signals. The signals of the control signal line G and the reset signal line RST are the high-level signals, and the first transistor T1, the fourth transistor T4, and the seventh transistor T7 are turned off. A signal of the scan signal line S is a low-level signal, and the second transistor T2 is turned off. A signal of the light emitting signal line E is a low-level signal, the fifth transistor T5 and the sixth transistor T6 are turned on, and a power supply voltage output from the first power supply line VDD provides a drive voltage to the first electrode of the light emitting element L through the turned-on fifth transistor T5, the third transistor T3, and the sixth transistor T6, to drive the light emitting element L to emit light.

In a drive process of the pixel circuit, a drive current flowing through the third transistor T3 (drive transistor) is determined by a voltage difference between a control electrode and a first electrode of the third transistor T3. Since the voltage of the first node N1 is Vd-|Vth|, the drive current of the third transistor T3 is as follows.

$$I=K*(Vgs-Vth)^2=K*[(Vdd-Vd+|Vth|)-Vth]^2=K*[(Vdd-Vd]^2$$

Among them, I is the drive current flowing through the third transistor T3, that is, a drive current for driving an OLED, K is a constant, Vgs is the voltage difference between the control electrode and the first electrode of the third transistor T3, Vth is the threshold voltage of the third transistor T3, Vd is the data voltage outputted by the data signal line DATA, and Vdd is the power supply voltage outputted by the first power supply line VDD.

In an exemplary embodiment, as shown in FIG. 3, the display substrate may further include a timing controller and a source drive circuit located in the non-display region.

In an exemplary embodiment, the timing controller may provide a gray-scale value and a control signal suitable for specifications of the source drive circuit to the source drive circuit, provide a clock signal, a scan start signal, and the like suitable for specifications of a scan drive circuit to the scan drive circuit, provide a clock signal, a control start signal, and the like suitable for specifications of a control drive circuit to the control drive circuit, and provide a clock signal, an emission stop signal, and the like suitable for specifications of a light emitting drive circuit to the light emitting drive circuit.

In an exemplary embodiment, the source drive circuit may generate a data voltage to be provided to a data signal line using a gray-scale value and a control signal received from the timing controller. For example, the source drive circuit may sample a gray-scale value using a clock signal, and apply a data voltage corresponding to the gray-scale value to a data signal line by taking a pixel row as a unit.

In an exemplary embodiment, the scan drive circuit may generate a scan signal to be provided to a scan signal line by receiving a clock signal, a scan start signal, or the like, from the timing controller. For example, the scan drive circuit may sequentially provide a scan signal with an on-level pulse to scan signal lines. For example, the scan drive circuit may be constructed in a form of a shift register and may generate a scan signal in a manner of sequentially transmitting a scan start signal provided in a form of an on-level pulse to a next stage circuit under control of a clock signal.

In an exemplary embodiment, the control drive circuit may generate a control signal to be provided to a control signal line by receiving a clock signal, a control start signal, and the like from the timing controller. For example, the control drive circuit may sequentially provide a control signal with an on-level pulse to control signal lines. For example, the control drive circuit may be constructed in a form of a shift register, and may generate a control signal in a manner of sequentially transmitting a control start signal provided in a form of an on-level pulse to a next stage circuit under control of a clock signal.

In an exemplary embodiment, the light emitting drive circuit may generate an emission signal to be provided to a light emitting signal line by receiving a clock signal, an emission stop signal, and the like from the timing controller. For example, the light emitting drive circuit may sequentially provide an emission signal with an off-level pulse to light emitting signal lines. For example, the light emitting drive circuit may be constructed in a form of a shift register and generate a light emitting signal in a manner of sequentially transmitting a light emitting stop signal provided in a form of an off-level pulse to a next stage circuit under control of a clock signal.

A display substrate according to an embodiment of the present disclosure includes a display region and a non-display region, the display region includes at least one rounded corner, the non-display region includes a rounded corner region located on an outside of the rounded corner; the display substrate includes a base substrate and a circuit structure layer disposed on the base substrate, the circuit structure layer includes pixel circuits arranged in an array and located in the display region and a control driver circuit located in the non-display region, a pixel circuit includes a reset transistor, the control drive circuit is configured to provide a drive signal to the reset transistor; the circuit structure layer further includes a plurality of reset output lines and a plurality of reset transfer lines located in the non-display region and disposed on a side of the control drive circuit close to the display region, a reset output line is disposed in a different layer from a reset transfer line, an extension direction of the reset output line and an extension direction of the reset transfer line intersect; a reset output line is electrically connected with the control drive circuit and a reset transfer line respectively, and the reset transfer line is connected with the pixel circuit; an orthographic projection of at least one reset transfer line located in the rounded corner region on the base substrate is partially overlapped with orthographic projections of the plurality of reset output lines on the base substrate. According to the present disclosure, an area occupied by the rounded corner region may be reduced by making an orthographic projection of at least one reset transfer line located in the rounded corner region on the base substrate be partially overlapped with orthographic projections of the plurality of reset output lines on the base substrate, and a narrow bezel may be achieved.

In an exemplary embodiment, as shown in FIGS. 4 and 5, the circuit structure layer may further include a reset connection line RST_CL located in the non-display region and disposed on a side of the control drive circuit close to the display region, the reset connection line RST_CL is disposed in a different layer from a reset output line RST_OL, and an extension direction of the reset connection line RST_CL and an extension direction of the reset output line RST_OL intersect.

In an exemplary embodiment, as shown in FIGS. 4 and 5, a reset connection line RST_CL is electrically connected with a reset transfer line RST_TL and a reset signal line, respectively. The control drive circuit is electrically connected with a reset signal line of a pixel circuit through a reset output line, a reset transfer line, and a reset connection line in turn.

In an exemplary embodiment, as shown in FIGS. 4 and 5, a reset connection line RST_CL may be disposed in a different layer from a reset signal line.

In an exemplary embodiment, as shown in FIG. 4, an orthographic projection of at least one reset connection line RST_CL located in the rounded corner region on the base substrate may be partially overlapped with orthographic projections of the plurality of reset output lines RST_OL on the base substrate. An orthographic projection of at least one reset connection line RST_CL located in the rounded corner region on the base substrate is partially overlapped with orthographic projections of the plurality of reset output lines RST_OL on the base substrate, an area occupied by the rounded corner region may be reduced, and a narrow bezel may be achieved.

In an exemplary embodiment, the control drive circuit may also be configured to provide a drive signal to a writing transistor.

In an exemplary embodiment, as shown in FIGS. 4 and 5, the circuit structure layer may further include a plurality of control output lines G_OL located in the non-display region and disposed on a side of the control drive circuit close to the display region, a control output line G_OL is disposed in a different layer from a reset output line RST_OL, and an extension direction of the control output line G_OL and an extension direction of the reset output line RST_OL intersect.

In an exemplary embodiment, as shown in FIGS. 4 and 5, a control output line G_OL is connected with the control drive circuit and a pixel circuit, respectively, and an orthographic projection of the control output line G_OL on the base substrate is partially overlapped with orthographic projections of the plurality of reset output lines RST_OL on the base substrate.

In an exemplary embodiment, as shown in FIGS. 4 and 5, the circuit structure layer further includes a control connection line G_CL located in the non-display region and disposed on a side of the control drive circuit close to the display region, a control connection line G_CL is disposed in a different layer from a reset output line RST_OL, and an extension direction of the control connection line G_CL and an extension direction of the reset output line RST_OL intersect.

In an exemplary embodiment, as shown in FIGS. 4 and 5, a control connection line G_CL may be electrically connected with a control output line G_OL and a control signal line, respectively. The control drive circuit is electrically connected with a control signal line of a pixel circuit through a control output line and a control connection line in turn.

In an exemplary embodiment, a control connection line G_CL may be disposed in a different layer from a control signal line.

In an exemplary embodiment, as shown in FIG. 4, at least one control connection line G_CL located in the rounded corner region may be partially overlapped with orthographic projections of the plurality of reset output lines RST_OL on the base substrate. At least one control connection line G_CL located in the rounded corner region is partially overlapped with orthographic projections of the plurality of reset output lines RST_OL on the base substrate, an area occupied by the rounded corner region may be reduced, and a narrow bezel may be achieved.

Figure 7:
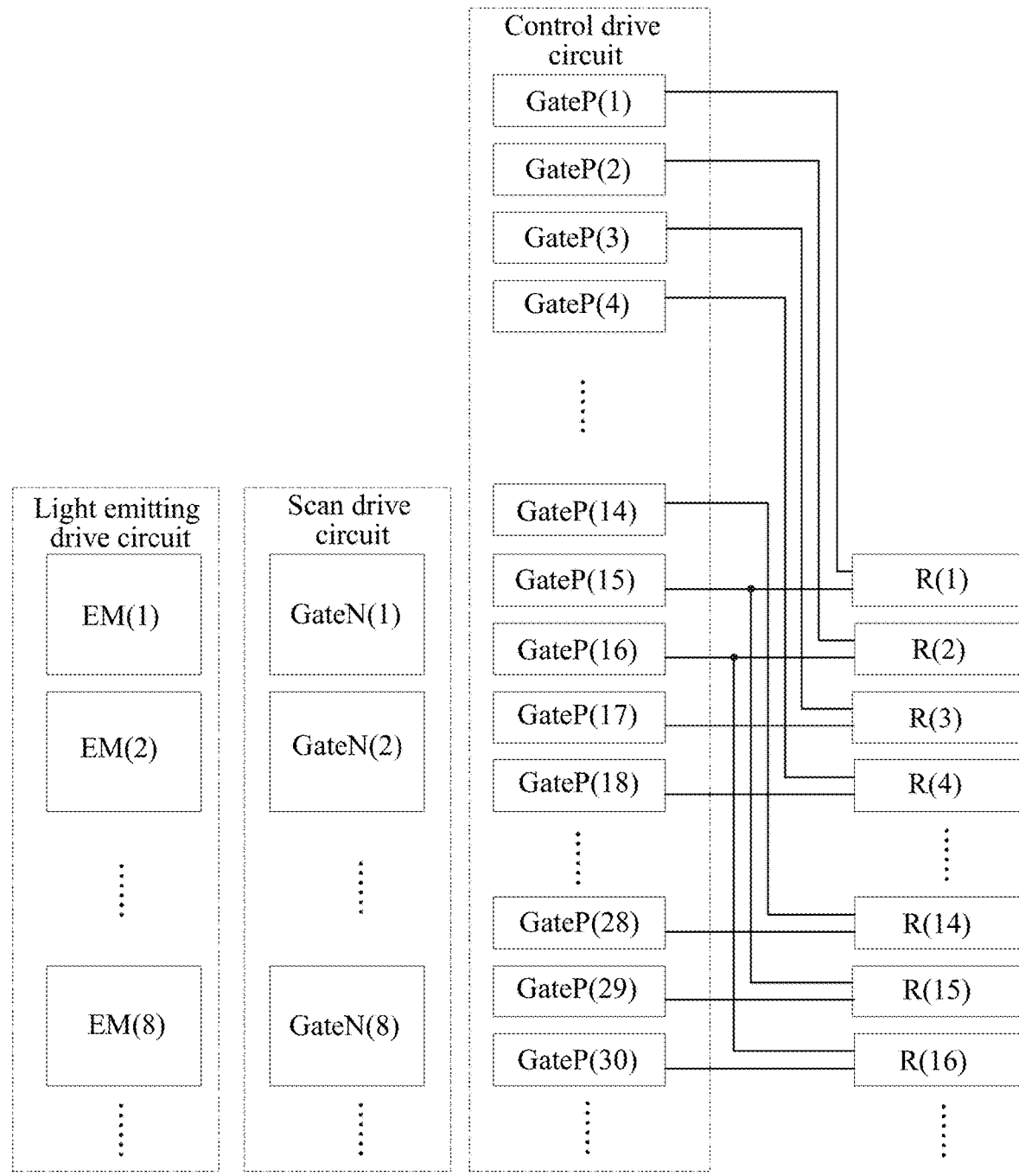
FIG. 7 is a schematic diagram of partial cascade of drive circuits according to an exemplary embodiment.

FIG. 7 is a schematic diagram of partial cascade of drive circuits according to an exemplary embodiment, and as shown in FIG. 7, the control drive circuit includes a plurality of cascaded control shift registers GateP, and a control shift register includes an output terminal. An output terminal of an i-th stage control shift register GateP (i) is electrically connected with an i-th reset output line RST_OL, 1≤i≤M, and an output terminal of a j-th stage control shift register of GateP (j) is electrically connected with a (j-S)-th control output line G_OL, S+1≤j≤M+S, M is a total number of rows of pixel circuits, S≥1. FIG. 7 is described by taking S=14 as an example.

In an exemplary embodiment, as shown in FIGS. 4 and 5, a reset output line RST_OL and a control output line G_OL connected with an output terminal of a same control shift register may be connected with each other, and an orthographic projection of the reset output line RST_OL on the base substrate is partially overlapped with an orthographic projection of the control output line G_OL on the base substrate.

In an exemplary embodiment, as shown in FIGS. 3 and 7, the circuit structure layer may further include a light emitting drive circuit located in the non-display region, the light emitting drive circuit is located on a side of the control drive circuit away from the display region, and the light emitting drive circuit is configured to provide a drive signal to a light emitting transistor.

In an exemplary embodiment, as shown in FIGS. 4 and 5, the circuit structure layer may further include a plurality of light emitting output lines EM_OL located in the non-display region and disposed on a side of the control drive circuit close to the display region, a light emitting output line EM_OL is disposed in a different layer from a reset output line RST_OL, and an extension direction of the light emitting output line EM_OL and an extension direction of the reset output line RST_OL intersect.

In an exemplary embodiment, as shown in FIGS. 4 and 5, a light emitting output line EM_OL is connected with the light emitting drive circuit and a pixel circuit, respectively, and an orthographic projection of the light emitting output line EM_OL on the base substrate is partially overlapped with orthographic projections of the plurality of reset output lines RST_OL on the base substrate.

In an exemplary embodiment, as shown in FIGS. 4 and 5, the circuit structure layer may further include a light emitting connection line E_CL located in the non-display region and disposed on a side of the control drive circuit close to the display region, a light emitting connection line E_CL is disposed in a different layer from a reset output line RST_OL, an extension direction of the light emitting connection line E_CL and an extension direction of the reset output line RST_OL intersect.

In an exemplary embodiment, as shown in FIGS. 4 and 5, a light emitting connection line E_CL is electrically connected with a light emitting output line E_OL and a light emitting signal line, respectively. The light emitting drive circuit is electrically connected with a light emitting signal line of a pixel circuit through a light emitting output line and a light emitting connection line in turn.

In an exemplary embodiment, a light emitting connection line E_CL is disposed in a different layer from a light emitting signal line.

In an exemplary embodiment, as shown in FIG. 4, at least one light emitting connection line E_CL located in the rounded corner region may be partially overlapped with orthographic projections of the plurality of reset output lines RST_OL on the base substrate. At least one light emitting connection line E_CL located in the rounded corner region is partially overlapped with orthographic projections of the plurality of reset output lines RST_OL on the base substrate, an area occupied by the rounded corner region may be reduced, and a narrow bezel may be achieved.

In an exemplary embodiment, as shown in FIG. 7, the light emitting drive circuit includes a plurality of cascaded light emitting shift registers EM(1) to EM(K1), and a light emitting shift register includes an output terminal. Herein, an output terminal of at least one stage light emitting shift register is electrically connected with the plurality of light emitting output lines E_OL. FIG. 4, FIG. 5, and FIG. 7 are illustrated by taking a case that an output terminal of one stage light emitting shift register is electrically connected with two light emitting output lines E_OL as an example.

In an exemplary embodiment, as shown in FIGS. 4 and 5, when a light emitting shift register is electrically connected with at least two light emitting output lines E_OL, the circuit structure layer may further include a light emitting connection part E_CN located in the non-display region and disposed on a side of the control drive circuit close to the display region; the light emitting connection part E_CN is disposed in a different layer from a light emitting output line E_OL, and an extension direction of the light emitting connection part E_CN and an extension direction of the light emitting output line E_OL intersect.

In an exemplary embodiment, as shown in FIGS. 4 and 5, at least two light emitting output lines E_OL connected with a same light emitting shift register may be electrically connected through the light emitting connection part E_CN.

In an exemplary embodiment, as shown in FIGS. 4 and 5, the light emitting connection part E_CN may be located on a side of the plurality of reset output lines RST_OL away from the display region.

In an exemplary embodiment, as shown in FIGS. 3 and 7, the circuit structure layer may further include a scan drive circuit located in the non-display region, the scan drive circuit is located between the control drive circuit and the light emitting drive circuit, and the scan drive circuit is configured to provide a drive signal to a compensation transistor.

In an exemplary embodiment, as shown in FIGS. 4 and 5, the circuit structure layer may further include a plurality of scan output lines S_OL located in the non-display region and disposed on a side of the control drive circuit close to the display region, a scan output line S_OL is disposed in a different layer from a reset output line RST_OL, and an extension direction of the scan output line S_OL and an extension direction of the reset output line RST_OL intersect.

In an exemplary embodiment, as shown in FIGS. 4 and 5, a scan output line S_OL is connected with the scan drive circuit and a pixel circuit, respectively, and an orthographic projection of the scan output line S_OL on the base substrate is partially overlapped with orthographic projections of the plurality of reset output lines RST_OL on the base substrate.

In an exemplary embodiment, as shown in FIGS. 4 and 5, the circuit structure layer may further include a scan connection line S_CL located in the non-display region and disposed on a side of the control drive circuit close to the display region, a scan connection line S_CL is disposed in a different layer from a reset output line RST_OL, an extension direction of the scan connection line S_CL and an extension direction of the reset output line RST_OL intersect.

In an exemplary embodiment, as shown in FIGS. 4 and 5, the scan connection line S_CL is electrically connected with a scan output line S_OL and a scan signal line, respectively. The scan drive circuit is electrically connected with a scan signal line of a pixel circuit through a scan output line and a scan connection line in turn.

In an exemplary embodiment, as shown in FIGS. 4 and 5, the scan connection line S_CL is disposed in a different layer from the scan signal line.

In an exemplary embodiment, as shown in FIG. 4, at least one scan connection line S_CL located in the rounded corner region may be partially overlapped with orthographic projections of the plurality of reset output lines RST_OL on the base substrate. At least one scan connection line S_CL located in the rounded corner region is partially overlapped with orthographic projections of the plurality of reset output lines RST_OL on the base substrate, an area occupied by the rounded corner region may be reduced, and a narrow bezel may be achieved.

In an exemplary embodiment, as shown in FIG. 7, the scan drive circuit includes a plurality of cascaded scan shift registers GateN (1) to GateN (K2), and a scan shift register includes an output terminal. Among them, an output terminal of at least one stage scan shift register may be electrically connected with a plurality of scan output lines S_OL. FIG. 4, FIG. 5, and FIG. 7 are illustrated by taking a case that an output terminal of one stage scan shift register is electrically connected with two scan output lines S_OL as an example.

In an exemplary embodiment, as shown in FIGS. 4 and 5, when a scan shift register is electrically connected with at least two scan output lines S_OL, the circuit structure layer further includes a scan connection part S_CN located in the non-display region and disposed on a side of the control drive circuit close to the display region; the scan connection part S_CN is disposed in a different layer from a scan output line S_OL, and an extension direction of the scan connection S_CN and an extension direction of the scan output line S_OL intersect.

In an exemplary embodiment, as shown in FIGS. 4 and 5, at least two scan output lines S_OL connected with a same scan shift register may be electrically connected through the scan connection part S_CN.

In an exemplary embodiment, as shown in FIGS. 4 and 5, the scan connection part S_CN may be located on a side of a plurality of reset output lines RST_OL away from the display region.

In an exemplary embodiment, as shown in FIGS. 4 and 5, the circuit structure layer may further include a plurality of first initial output lines INIT1_OL located in the non-display region and disposed on a side of the control drive circuit close to the display region, a first initial output line INIT1_OL is disposed in a different layer from a reset output line RST_OL, and an extension direction of the first initial output line INIT1_OL and an extension direction of a reset output line RST_OL intersect.

In an exemplary embodiment, as shown in FIGS. 4 and 5, the first initial output line INIT1_OL may be electrically connected with one of a first initial signal line and a second initial signal line of a pixel circuit.

In an exemplary embodiment, an orthographic projection of the first initial output line INIT1_OL on the base substrate is partially overlapped with orthographic projections of the plurality of reset output lines RST_OL on the base substrate.

In an exemplary embodiment, as shown in FIGS. 4 and 5, the circuit structure layer further includes a plurality of first initial connection lines INIT1_CL located in the non-display region and disposed on a side of the control drive circuit close to the display region, a first initial connection line INIT1_CL is disposed in a different layer from a reset output line RST_OL, and an extension direction of the first initial connection line INIT1_CL and an extension direction of a reset output line RST_OL intersect.

In an exemplary embodiment, as shown in FIGS. 4 and 5, the first initial output line INIT1_OL is electrically connected with one of the first initial signal line and the second initial signal line of the pixel circuit through the first initial connection line INIT1_CL.

In an exemplary embodiment, as shown in FIG. 4, an orthographic projection of the first initial connection line INIT1_CL located in the rounded corner region on the base substrate may be partially overlapped with orthographic projections of a plurality of reset output lines RST_OL on the base substrate. An orthographic projection of the first initial connection line INIT1_CL located in the rounded corner region on the base substrate is partially overlapped with orthographic projections of the plurality of reset output lines RST_OL on the base substrate, an area occupied by the rounded corner region may be reduced, and a narrow bezel may be achieved.

In an exemplary embodiment, as shown in FIGS. 4 and 5, the circuit structure layer may further include a first initial power supply line INIT1_SL located in the non-display region and disposed on a side of the control drive circuit close to the display region, the first initial power supply line INIT1_SL is disposed in a different layer from a reset output line RST_OL, and an extension direction of the first initial power supply line INIT1_SL is parallel to an extension direction of the reset output line RST_OL.

In an exemplary embodiment, as shown in FIGS. 4 and 5, the first initial power supply line INIT1_SL is electrically connected with a plurality of first initial output lines INIT1_OL. The first initial power supply line INIT1_SL is electrically connected with a first initial signal line of a pixel circuit through a first initial output line INIT1_OL and a first initial connection line INIT1_CL.

In an exemplary embodiment, the first initial power supply line INIT1_SL is disposed in a different layer from the first initial output line INIT1_OL.

In an exemplary embodiment, as shown in FIGS. 4 and 5, an orthographic projection of the first initial power supply line INIT1_SL on the base substrate is at least partially overlapped with orthographic projections of the plurality of reset output lines RST_OL on the base substrate.

In an exemplary embodiment, as shown in FIGS. 4 and 5, the circuit structure layer may further include a plurality of second initial connection lines INIT2_CL located in the non-display region and disposed on a side of the control drive circuit close to the display region, a second initial connection line INIT2_CL is disposed in a different layer from a reset output line RST_OL, an extension direction of the second initial connection line INIT2_CL and an extension direction of the reset output line RST_OL intersect, and an extension direction of the first initial connection line INIT1_CL is parallel to an extension direction of the second initial connection line INIT2_CL.

In an exemplary embodiment, as shown in FIGS. 4 and 5, the second initial connection line INIT2_CL may be electrically connected with the other of the first initial signal line and the second initial signal line of the pixel circuit. The first initial connection line INIT1_CL is electrically connected with the second initial signal line when the second initial connection line INIT2_CL is electrically connected with the first initial signal line, and the first initial connection line INIT1_CL is electrically connected with the first initial signal line when the second initial connection line INIT2_CL is electrically connected with the second initial signal line, which is not limited in present disclosure.

In an exemplary embodiment, as shown in FIGS. 4 and 5, an orthographic projection of the second initial connection line INIT2_CL on the base substrate is partially overlapped with orthographic projections of the plurality of reset output lines RST_OL on the base substrate.

In an exemplary embodiment, as shown in FIGS. 4 and 5, the circuit structure layer may further include a second initial power supply line INIT2_SL located in the non-display region and disposed on a side of the control drive circuit close to the display region, the second initial power supply line INIT2_SL is disposed in a different layer from a reset output line RST_OL and is disposed in a same layer as the second initial connection line INIT2_CL, an extension direction of the first initial power supply line INIT1_SL and an extension direction of the second initial power supply line INIT2_SL are parallel, and the second initial power supply line INIT2_SL is located on a side of the first initial power supply line INIT1_SL close to the display region.

In an exemplary embodiment, as shown in FIGS. 4 and 5, the second initial power supply line INIT2_SL and the second initial connection line INIT2_CL may be of an integral structure.

In an exemplary embodiment, as shown in FIGS. 4 and 5, the second initial power supply line INIT2_SL is electrically connected with the plurality of second initial connection lines INIT2_CL, and an orthographic projection of the second initial power supply line INIT2_SL on the base substrate is at least partially overlapped with orthographic projections of the plurality of reset output lines RST_OL on the base substrate.

Figure 8:
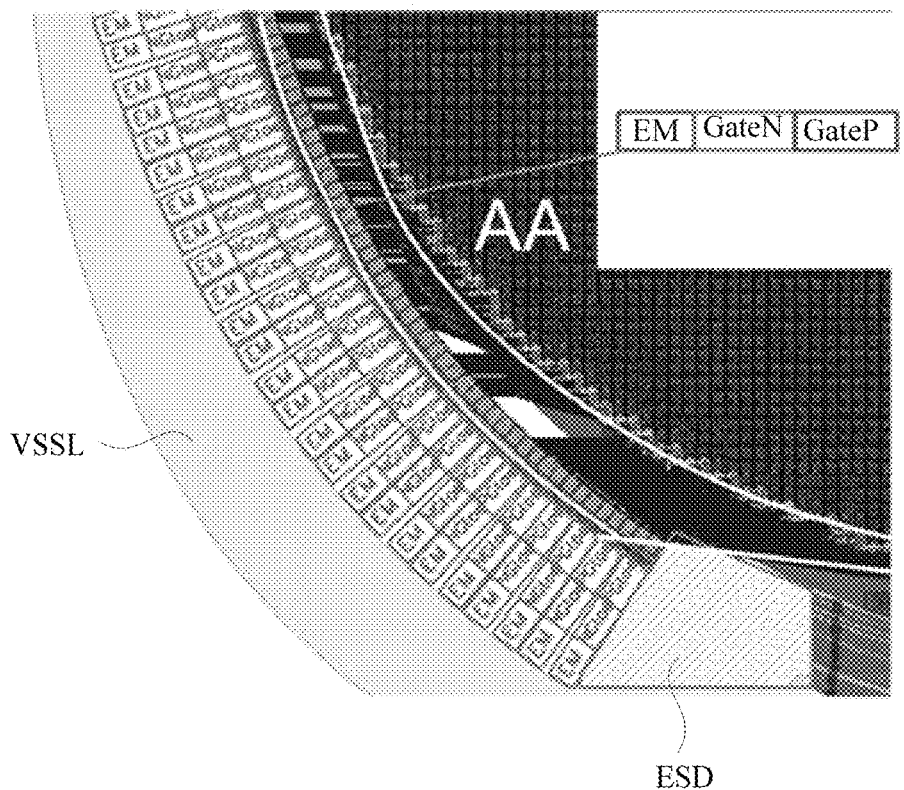
FIG. 8 is a schematic diagram of a structure of a rounded corner region of a display substrate according to an exemplary embodiment.

FIG. 8 is a schematic diagram of a structure of a rounded corner region of a display substrate according to an exemplary embodiment. As shown in FIG. 8, in an exemplary embodiment, multi-stage control shift registers located in a rounded corner region may be arranged along a boundary of a rounded corner.

In an exemplary embodiment, as shown in FIG. 8, multi-stage light emitting shift registers EM located in the rounded corner region may be arranged along the boundary of the rounded corner.

In an exemplary embodiment, as shown in FIG. 8, multi-stage scan shift registers GateN located in the rounded corner region are arranged along the boundary of the rounded corner.

In an exemplary embodiment, as shown in FIG. 8, the display substrate may further include a low-level power supply line VSSL located on a side of a light emitting drive circuit away from a display region AA. The low-level power supply line VSSL is electrically connected with a cathode of a light emitting element and is configured to provide a low-level signal to the cathode of the light emitting element.

In an exemplary embodiment, as shown in FIG. 8, the display substrate may further include an electrostatic discharge circuit ESD located in a non-display region. Herein, the electrostatic discharge circuit may be configured to discharge static electricity in a plurality of drive circuits.

In an exemplary embodiment, a light emitting shift register EM may include multiple light emitting transistors and multiple light emitting capacitors. A circuit structure of the light emitting shift register may be 13T3C or 10T3C, which is not limited in the present disclosure.

In an exemplary embodiment, a scan shift register GateN may include multiple scan transistors and multiple scan capacitors. A circuit structure of the scan shift register may be 13T3C or 10T3C, which is not limited in the present disclosure.

In an exemplary embodiment, a control shift register GateP includes a plurality of control transistors and a plurality of control capacitors, and a circuit structure of the control shift register may be 8T2C, which is not limited in present disclosure.

Figure 9A:
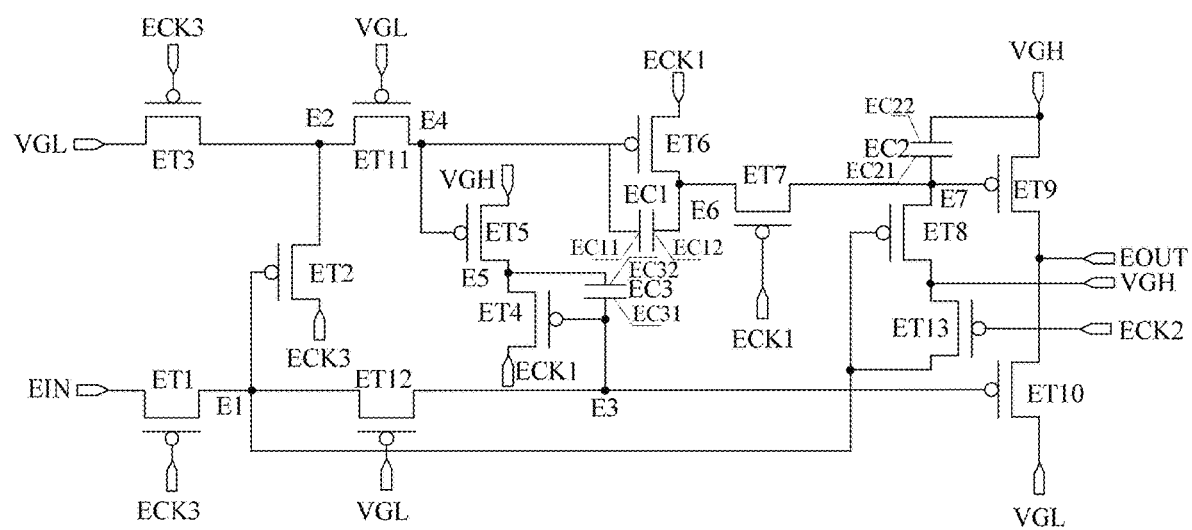
FIG. 9A is an equivalent circuit diagram of a light emitting shift register according to an exemplary embodiment.
Figure 9B:
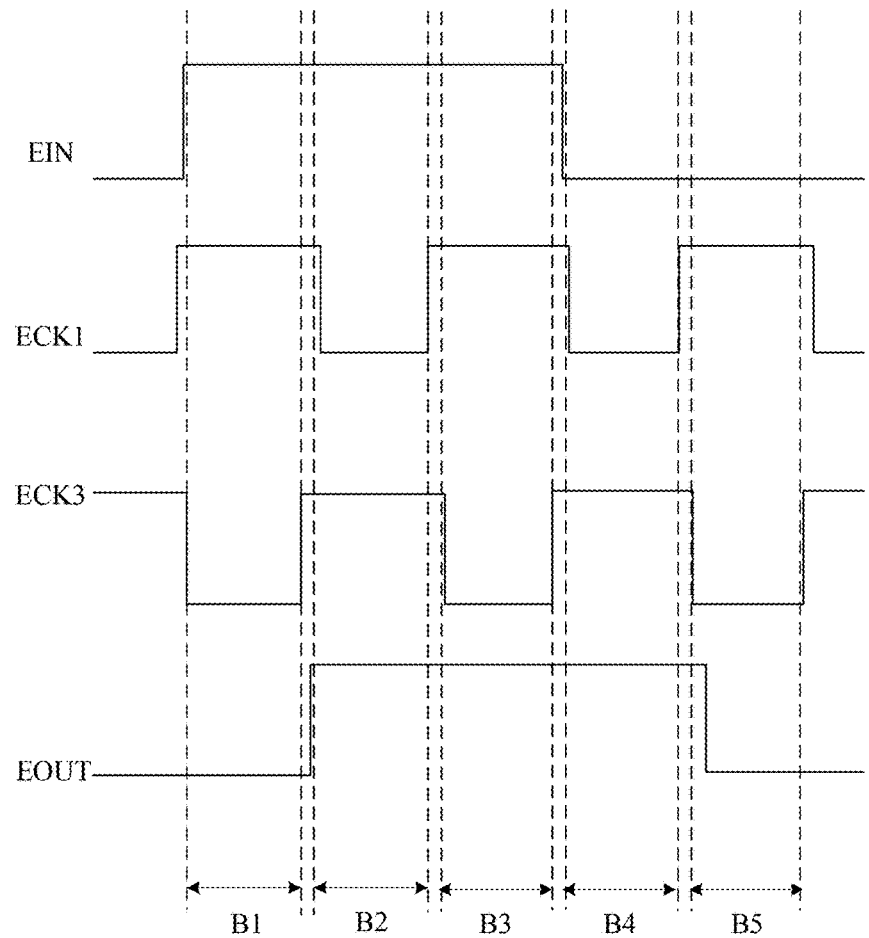
FIG. 9B is a timing diagram of the light emitting shift register provided in FIG. 9A.

FIG. 9A is an equivalent circuit diagram of a light emitting shift register according to an exemplary embodiment, and FIG. 9B is a timing diagram of the light emitting shift register provided in FIG. 9A. As shown in FIG. 9A and FIG. 9B, in an exemplary embodiment, the light emitting shift register includes a first light emitting transistor ET1 to a thirteenth light emitting transistor ET13 and a first light emitting capacitor EC1 to a third light emitting capacitor EC3.

In an exemplary embodiment, a control electrode of the first light emitting transistor ET1 is electrically connected with a third clock signal terminal ECK3, a first electrode of the first light emitting transistor ET1 is electrically connected with an input terminal EIN, and a second electrode of the first light emitting transistor ET1 is electrically connected with a first node E1. A control electrode of the second light emitting transistor ET2 is electrically connected with the first node E1, a first electrode of the second light emitting transistor ET2 is electrically connected with the third clock signal terminal ECK3, and a second electrode of the second light emitting transistor ET2 is electrically connected with a second node E2. A control electrode of the third light emitting transistor ET3 is electrically connected with the third clock signal terminal ECK3, a first electrode of the third light emitting transistor ET3 is electrically connected with a second power supply terminal VGL, and a second electrode of the third light emitting transistor ET3 is electrically connected with the second node E2. A control electrode of the fourth light emitting transistor ET4 is electrically connected with a third node E3, a first electrode of the fourth light emitting transistor ET4 is electrically connected with a first clock signal terminal ECK1, and a second electrode of the fourth light emitting transistor ET4 is electrically connected with a fifth node E5. A control electrode of the fifth light emitting transistor ET5 is electrically connected with a fourth node E4, a first electrode of the fifth light emitting transistor ET5 is electrically connected with the fifth node E5, and a second electrode of the fifth light emitting transistor ET5 is electrically connected with a first power supply terminal VGH. A control electrode of the sixth light emitting transistor ET6 is electrically connected with the fourth node E4, a first electrode of the sixth light emitting transistor ET6 is electrically connected with the first clock signal terminal ECK1, and a second electrode of the sixth light emitting transistor ET6 is electrically connected with a sixth node E6. A control electrode of the seventh light emitting transistor ET7 is electrically connected with the first clock signal terminal ECK1, a first electrode of the seventh light emitting transistor ET7 is electrically connected with the sixth node E6, and a second electrode of the seventh light emitting transistor ET7 is electrically connected with a seventh node E7. A control electrode of the eighth light emitting transistor ET8 is electrically connected with the first node E1, a first electrode of the eighth light emitting transistor ET8 is electrically connected with the first power supply terminal VGH, and a second electrode of the eighth light emitting transistor ET8 is electrically connected with the seventh node E7. A control electrode of the ninth light emitting transistor ET9 is electrically connected with the seventh node E7, a first electrode of the ninth light emitting transistor ET9 is electrically connected with the first power supply terminal VGH, and a second electrode of the ninth light emitting transistor ET9 is electrically connected with an output terminal EOUT. A control electrode of the tenth light emitting transistor ET10 is electrically connected with the third node E3, a first electrode of the tenth light emitting transistor ET10 is electrically connected with the second power supply terminal VGL, and a second electrode of the tenth light emitting transistor ET10 is electrically connected with the output terminal EOUT. A control electrode of the eleventh light emitting transistor ET11 is electrically connected with the second power supply terminal VGL, a first electrode of the eleventh light emitting transistor ET11 is electrically connected with the second node E2, and a second electrode of the eleventh light emitting transistor ET11 is electrically connected with the fourth node E4. A control electrode of the twelfth light emitting transistor ET12 is electrically connected with the second power supply terminal VGL, a first electrode of the twelfth light emitting transistor ET12 is electrically connected with the first node E1, and a second electrode of the twelfth light emitting transistor ET12 is electrically connected with the third node E3. A control electrode of the thirteenth light emitting transistor ET13 is electrically connected with a second clock signal terminal ECK2, a first electrode of the thirteenth light emitting transistor ET13 is electrically connected with the first node E1, and a second electrode of the thirteenth light emitting transistor ET13 is electrically connected with the first power supply terminal VGH. A first electrode plate EC11 of the first light emitting capacitor EC1 is electrically connected with the fourth node E4, and a second electrode plate EC12 of the first light emitting capacitor EC1 is electrically connected with the sixth node E6. A first electrode plate EC21 of the second light emitting capacitor EC2 is electrically connected with the seventh node E7, and a second electrode plate EC22 of the second light emitting capacitor EC2 is electrically connected with the first power supply terminal VGH. A first electrode plate EC31 of the third light emitting capacitor EC3 is electrically connected with the third node E3, and a second electrode plate EC32 of the third light emitting capacitor EC3 is electrically connected with the fifth node E5.

In an exemplary embodiment, the first light emitting transistor ET1 to the thirteenth light emitting transistor ET13 may be P-type transistors or may be N-type transistors.

In an exemplary embodiment, the first power supply terminal VGH continuously provides a high-level signal, and the second power supply terminal VGL continuously provides a low-level signal. Since the second power supply terminal VGL continuously provides the low-level signal, the eleventh light emitting transistor ET11 and the twelfth light emitting transistor ET12 are continuously turned on.

In an exemplary embodiment, a signal of the second clock signal terminal ECK2 is a low-level signal in a startup initialization stage, which prevents a ninth light emitting transistor ET9 and a tenth light emitting transistor ET10 of a last light emitting shift register from simultaneously being turned on due to delay of an output signal, or is a low-level signal in an abnormal shutdown stage, which prevents the ninth light emitting transistor ET9 and the tenth light emitting transistor ET10 from simultaneously being turned on. The second clock signal terminal ECK2 continuously provides a high-level signal in a normal display stage, i.e. the thirteenth light emitting transistor ET13 is continuously turned off in the normal display stage.

Taking the first light emitting transistor ET1 to the thirteenth light emitting transistor ET13 being P-type transistors as an example, as shown in FIG. 9B, a working process of a light emitting shift register according to an exemplary embodiment includes following stages.

In a first stage B1, a signal of the first clock signal terminal ECK1 is a high-level signal, and a signal of the third clock signal terminal ECK3 is a low-level signal. The signal of the third clock signal terminal ECK3 is the low-level signal, the first light emitting transistor ET1, the third light emitting transistor ET3, and the twelfth light emitting transistor ET12 are turned on, the turned-on first light emitting transistor ET1 transmits a high-level signal of the input terminal EIN to the first node E1, so that a level of the first node E1 is changed to be a high level, the turned-on twelfth light emitting transistor ET12 transmits the high-level signal of the first node E1 to the third node E2, and the second light emitting transistor ET2, the fourth light emitting transistor ET4, the eighth light emitting transistor ET8, and the tenth light emitting transistor ET10 are turned off. In addition, the turned-on third light emitting transistor ET3 transmits a low-level signal of the second power supply terminal VGL to the second node E2, so that a level of the second node E2 is changed to be a low level, the turned-on eleventh light emitting transistor ET11 transmits a low-level signal of the second node E2 to the fourth node E4, so that a level of the fourth node E4 is changed to be a low level, and the fifth light emitting transistor ET5 and the sixth light emitting transistor ET6 are turned on. The signal of the first clock signal terminal ECK1 is the high-level signal, and the seventh light emitting transistor ET7 is turned off. In addition, the ninth light emitting transistor ET9 is turned off under an action of the third light emitting capacitor EC3. In a first stage P1, since both the ninth light emitting transistor ET9 and the tenth light emitting transistor ET10 are turned off, a signal of the output terminal EOUT is kept at a previous low level.

In a second stage B2, a signal of the first clock signal terminal ECK1 is a low-level signal, and a signal of the third clock signal terminal ECK3 is a high-level signal. The signal of the first clock signal terminal ECK1 is the low-level signal, and the seventh light emitting transistor ET7 is turned on. The signal of the third clock signal terminal ECK3 is the high-level signal, and the first light emitting transistor ET1 and the third light emitting transistor ET3 are turned off. Under an action of the third light emitting capacitor EC3, the first node E1 and the third node E3 may continue to maintain a high-level signal of a previous stage, and under an action of the first light emitting capacitor EC1, the fourth node E4 may continue to maintain a low level of the previous stage, so the fifth light emitting transistor ET5 and the sixth light emitting transistor ET6 are turned on. The second light emitting transistor ET2, the fourth light emitting transistor ET4, the eighth light emitting transistor ET8, and the tenth light emitting transistor ET10 are turned off. In addition, the low-level signal of the first clock signal terminal ECK1 is transmitted to the seventh node E7 through the turned-on sixth light emitting transistor ET6 and the seventh light emitting transistor ET7, the ninth light emitting transistor ET9 is turned on, the turned-on ninth light emitting transistor ET9 outputs a high-level signal of the first power supply terminal VGH, so a signal of the output terminal EOUT is a high-level signal.

In a third stage B3, a signal of the third clock signal terminal ECK3 is a low-level signal and a signal of the first clock signal terminal ECK1 is a high-level signal. The signal of the first clock signal terminal ECK1 is the high-level signal, and the seventh light emitting transistor ET7 is turned off. The second light emitting transistor ET2, the fourth light emitting transistor ET4, the eighth light emitting transistor ET8, and the tenth light emitting transistor ET10 are turned off. The signal of the third clock signal terminal ECK3 is the low-level signal, and the first light emitting transistor ET1 and the third light emitting transistor ET3 are turned on. Under an action of the second light emitting capacitor EC3, the ninth light emitting transistor ET9 maintains a turned-on state, and the turned-on ninth light emitting transistor ET9 outputs a high-level signal of the first power supply terminal VGH, so a signal of the output terminal EOUT is still a high-level signal.

In a fourth stage B4, a signal of the first clock signal terminal ECK1 is a low-level signal and a signal of the third clock signal terminal ECK3 is a high-level signal. The signal of the third clock signal terminal ECK3 is the high-level signal, and the first light emitting transistor ET1 and the third light emitting transistor ET3 are turned off. The signal of the first clock signal terminal ECK1 is at a low level, and the seventh light emitting transistor ET7 is turned on. Due to a storage effect of the third light emitting capacitor EC3, the first node E1 and the third node E3 maintain a high-level signal of a previous stage, so that the second light emitting transistor ET2, the fourth light emitting transistor ET4, the eighth light emitting transistor ET8, and the tenth light emitting transistor ET10 are turned off. Due to a storage effect of the first light emitting capacitor EC1, the fourth node E4 continues to maintain a low level of the previous stage, so that the fifth light emitting transistor ET5 and the sixth light emitting transistor ET6 are turned on. In addition, the low-level signal of the first clock signal terminal ECK1 is transmitted to the seventh node E7 through the turned-on sixth light emitting transistor ET6 and the seventh light emitting transistor ET7, the turned-on ninth light emitting transistor ET9 outputs a high-level signal of the first power supply terminal VGH, so a signal of the output terminal EOUT is still a high-level signal.

In a fifth stage B5, a signal of the first clock signal terminal ECK1 is a high-level signal and a signal of the third clock signal terminal ECK3 is a low-level signal. The signal of the third clock signal terminal ECK3 is the low-level signal, and the first light emitting transistor ET1 and the third light emitting transistor ET3 are turned on. The signal of the first clock signal terminal ECK1 is the high-level signal, and the seventh light emitting transistor ET7 is turned off. The turned-on first light emitting transistor ET1 transmits a low-level signal of the input terminal EIN to the first node E1, so that a level of the first node E1 is changed to be a low level, the turned-on twelfth light emitting transistor ET12 transmits a low-level signal of the first node E1 to the third node E3, so that a level of the third node E3 is changed to be a low level, and the second light emitting transistor ET2, the fourth light emitting transistor ET4, the eighth light emitting transistor ET8, and the tenth light emitting transistor ET10 are turned on. The turned-on second light emitting transistor ET2 transmits a signal of the third clock signal terminal ECK3 with a low level to the second node E2, so that a level of the second node E2 may be further lowered, so the second node E2 and the fourth node E4 continue to maintain a low level of a previous stage, so that the fifth light emitting transistor ET5 and the sixth light emitting transistor ET6 are turned on. The signal of the first clock signal terminal ECK1 is the high-level signal, and the seventh light emitting transistor ET7 is turned off. In addition, the turned-on eighth light emitting transistor ET8 transmits a high-level signal of the first power supply terminal VGH to the seventh node E7, and the ninth light emitting transistor ET9 is turned off. The turned-on tenth light emitting transistor ET10 outputs a low-level signal of the second power supply terminal VGL, so a signal of the output terminal EOUT is changed to be at a low level.

Figure 10A:
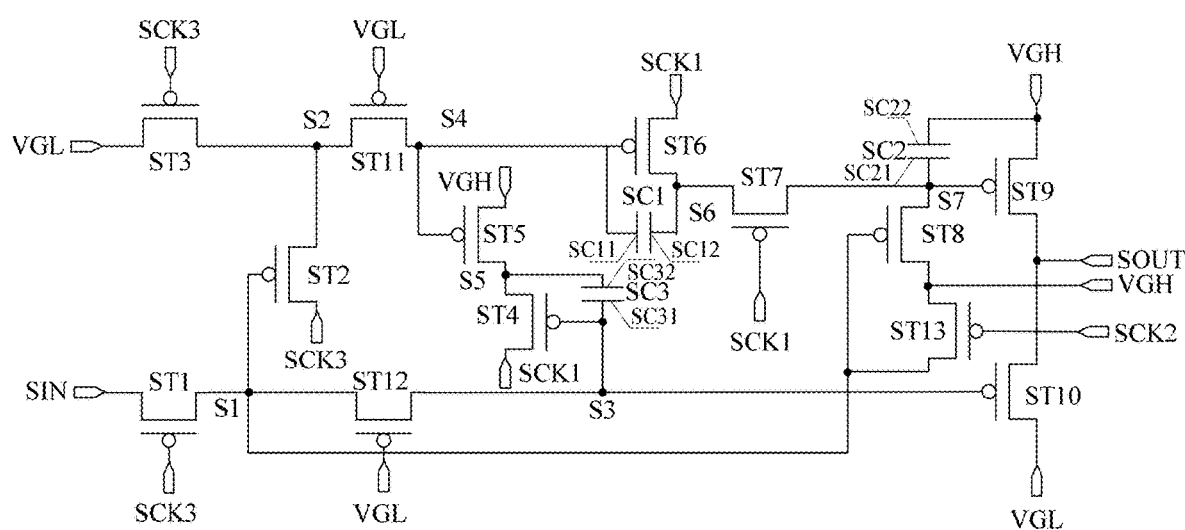
FIG. 10A is an equivalent circuit diagram of a scan shift register according to an exemplary embodiment.
Figure 10B:
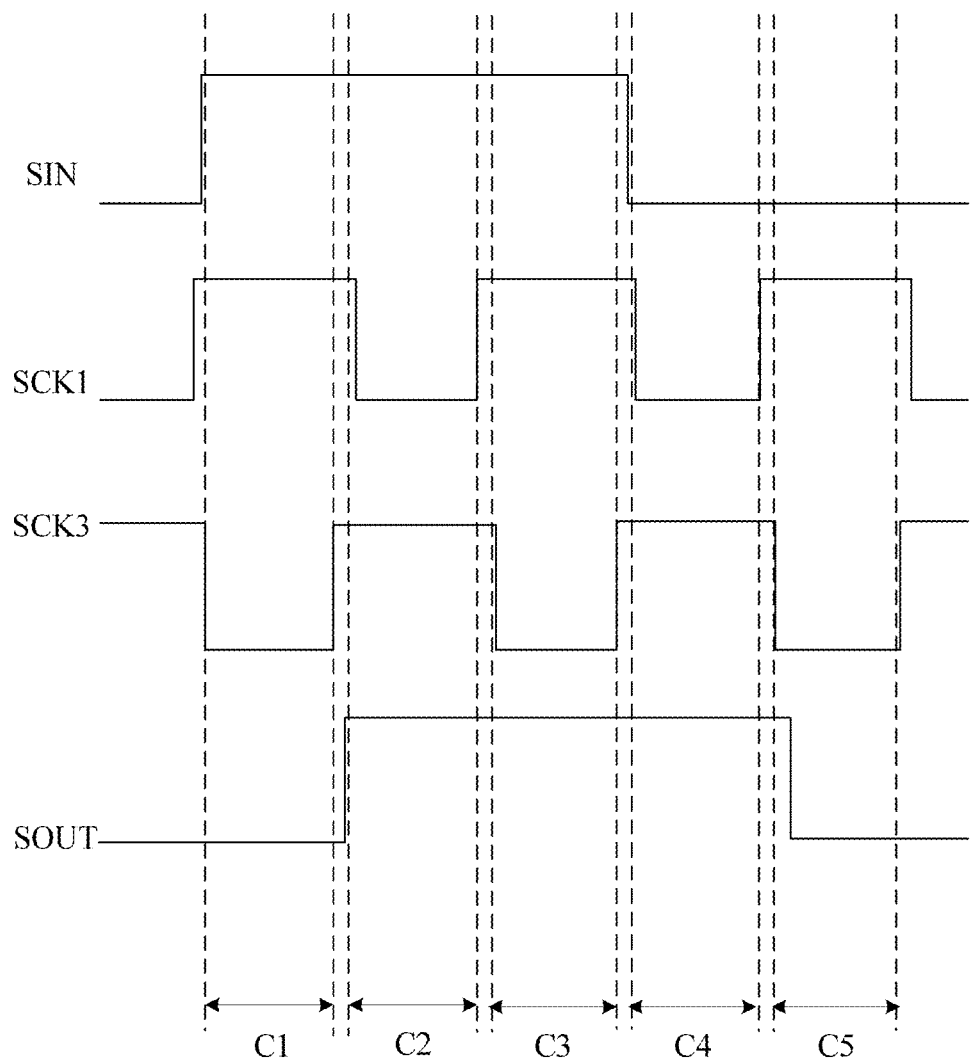
FIG. 10B is a timing diagram of the scan shift register provided in FIG. 10A.

FIG. 10A is an equivalent circuit diagram of a scan shift register according to an exemplary embodiment, and FIG. 10B is a timing diagram of the scan shift register provided in FIG. 10A. As shown in FIG. 10A and FIG. 10B, in an exemplary embodiment, a scan shift register includes a first scan transistor ST1 to a thirteenth scan transistor ST13, and a first scan capacitor SC1 to a third scan capacitor SC3.

In an exemplary embodiment, a control electrode of the first scan transistor ST1 is electrically connected with a third clock signal terminal SCK3, a first electrode of the first scan transistor ST1 is electrically connected with an input terminal SIN, and a second electrode of the first scan transistor ST1 is electrically connected with a first node S1. A control electrode of the second scan transistor ST2 is electrically connected with the first node S1, a first electrode of the second scan transistor ST2 is electrically connected with the third clock signal terminal SCK3, and a second electrode of the second scan transistor ST2 is electrically connected with a second node S2. A control electrode of the third scan transistor ST3 is electrically connected with the third clock signal terminal SCK3, a first electrode of the third scan transistor ST3 is electrically connected with a second power supply terminal VGL, and a second electrode of the third scan transistor ST3 is electrically connected with the second node S2. A control electrode of the fourth scan transistor ST4 is electrically connected with a third node S3, a first electrode of the fourth scan transistor ST4 is electrically connected with a first clock signal terminal SCK1, and a second electrode of the fourth scan transistor ST4 is electrically connected with a fifth node S5. A control electrode of the fifth scan transistor ST5 is electrically connected with a fourth node S4, a first electrode of the fifth scan transistor ST5 is electrically connected with the fifth node S5, and a second electrode of the fifth scan transistor ST5 is electrically connected with a first power supply terminal VGH. A control electrode of the sixth scan transistor ST6 is electrically connected with the fourth node S4, a first electrode of the sixth scan transistor ST6 is electrically connected with the first clock signal terminal SCK1, and a second electrode of the sixth scan transistor ST6 is electrically connected with a sixth node S6. A control electrode of the seventh scan transistor ST7 is electrically connected with the first clock signal terminal SCK1, a first electrode of the seventh scan transistor ST7 is electrically connected with the sixth node S6, and a second electrode of the seventh scan transistor ST7 is electrically connected with a seventh node S7. A control electrode of the eighth scan transistor ST8 is electrically connected with the first node S1, a first electrode of the eighth scan transistor ST8 is electrically connected with the first power supply terminal VGH, and a second electrode of the eighth scan transistor ST8 is electrically connected with the seventh node S7. A control electrode of the ninth scan transistor ST9 is electrically connected with the seventh node S7, a first electrode of the ninth scan transistor ST9 is electrically connected with the first power supply terminal VGH, and a second electrode of the ninth scan transistor ST9 is electrically connected with an output terminal SOUT. A control electrode of the tenth scan transistor ST10 is electrically connected with the third node S3, a first electrode of the tenth scan transistor ST10 is electrically connected with the second power supply terminal VGL, and a second electrode of the tenth scan transistor ST10 is electrically connected with the output terminal SOUT. A control electrode of the eleventh scan transistor ST11 is electrically connected with the second power supply terminal VGL, a first electrode of the eleventh scan transistor ST11 is electrically connected with the second node S2, and a second electrode of the eleventh scan transistor ST11 is electrically connected with the fourth node S4. A control electrode of the twelfth scan transistor ST12 is electrically connected with the second power supply terminal VGL, a first electrode of the twelfth scan transistor ST12 is electrically connected with the first node S1, and a second electrode of the twelfth scan transistor ST12 is electrically connected with the third node S3. A control electrode of the thirteenth scan transistor ST13 is electrically connected with a second clock signal terminal SCK2, a first electrode of the thirteenth scan transistor ST13 is electrically connected with the first node S1, and a second electrode of the thirteenth scan transistor ST13 is electrically connected with the first power supply terminal VGH. A first electrode plate SC11 of the first scan capacitor SC1 is electrically connected with the fourth node S4, and a second electrode plate SC12 of the first scan capacitor SC1 is electrically connected with the sixth node S6. A first electrode plate SC21 of the second scan capacitor SC2 is electrically connected with the seventh node S7, and a second electrode plate SC22 of the second scan capacitor SC2 is electrically connected with the first power supply terminal VGH. A first electrode plate SC31 of the third scan capacitor SC3 is electrically connected with the third node S3, and a second electrode plate SC32 of the third scan capacitor SC3 is electrically connected with the fifth node S5.

In an exemplary embodiment, the first scan transistor ST1 to the thirteenth scan transistor ST13 may be P-type transistors or may be N-type transistors. The tenth scan transistor ST10 is an output transistor.

In an exemplary embodiment, the first power supply terminal VGH continuously provides a high-level signal, and the second power supply terminal VGL continuously provides a low-level signal. Since the second power supply terminal VGL continuously provides the low-level signal, the eleventh scan transistor ST11 and the twelfth scan transistor ST12 are continuously turned on.

In an exemplary embodiment, the second clock signal terminal SCK2 is a low-level signal in a startup initialization stage, which prevents a ninth scan transistor ST9 and a tenth scan transistor ST10 of a scan shift register of a last stage from simultaneously being turned on due to delay of an output signal, or is a low-level signal in an abnormal shutdown stage, which prevents the ninth scan transistor ST9 and the tenth scan transistor ST10 from simultaneously being turned on. The second clock signal terminal SCK2 continuously provides a high-level signal in a normal display stage, i.e. the thirteenth scan transistor ST13 is continuously turned off in the normal display stage.

Taking the first scan transistor ST1 to the thirteenth scan transistor ST13 being P-type transistors as an example, as shown in FIG. 10B, a working process of a scan shift register according to an exemplary embodiment includes following stages.

In a first stage C1, a signal of the first clock signal terminal SCK1 is a high-level signal, and a signal of the third clock signal terminal SCK3 is a low-level signal. The signal of the third clock signal terminal SCK3 is a low-level signal, the first scan transistor ST1, the third scan transistor ST3, and the twelfth scan transistor ST12 are turned on, the turned-on first scan transistor ST1 transmits a high-level signal of the input terminal SIN to the first node S1, so that a level of the first node S1 is changed to be a high-level signal, the turned-on twelfth scan transistor ST12 transmits the high-level signal of the first node S1 to the third node S2, and the second scan transistor ST2, the fourth scan transistor ST4, the eighth scan transistor ST8, and the tenth scan transistor ST10 are turn off. In addition, the turned-on third scan transistor ST3 transmits a low-level signal of the second power supply terminal VGL to the second node S2, so that a level of the second node S2 is changed to be a low level, the turned-on eleventh scan transistor ST11 transmits a low-level signal of the second node S2 to the fourth node S4, so that a level of the fourth node S4 is changed to be a low level, and the fifth scan transistor ST5 and the sixth scan transistor ST6 are turned on. The signal of the first clock signal line SCK1 is the high-level signal, and the seventh scan transistor ST7 is turn off. In addition, the ninth scan transistor ST9 is turn off under an action of the third scan capacitor SC3. In a first stage P1, since both the ninth scan transistor ST9 and the tenth scan transistor ST10 are turned off, a signal of the output terminal SOUT is kept at a previous low level.

In a second stage C2, a signal of the first clock signal terminal SCK1 is a low-level signal and a signal of the third clock signal terminal SCK3 is a high-level signal. The signal of the first clock signal terminal SCK1 is the low-level signal, and the seventh scan transistor ST7 is turned on. The signal of the third clock signal terminal SCK3 is the high-level signal, and the first scan transistor ST1 and the third scan transistor ST3 are turned off. Under an action of the third scan capacitor SC3, the first node S1 and the third node S3 may continue to maintain a high-level signal of a previous stage, and under an action of the first scan capacitor SC1, the fourth node S4 may continue to maintain a low level of the previous stage, so the fifth scan transistor ST5 and the sixth scan transistor ST6 are turned on. The second scan transistor ST2, the fourth scan transistor ST4, the eighth scan transistor ST8, and the tenth scan transistor ST10 are turn off. In addition, the low-level signal of the first clock signal terminal SCK1 is transmitted to the seventh node S7 through the turned-on sixth scan transistor ST6 and the seventh scan transistor ST7, the ninth scan transistor ST9 is turned on, and the turned-on ninth scan transistor ST9 outputs a high-level signal of the first power supply terminal VGH, so a signal of the output terminal SOUT is a high-level signal.

In a third stage C3, a signal of the third clock signal terminal SCK3 is a low-level signal and a signal of the first clock signal terminal SCK1 is a high-level signal. The signal of the first clock signal terminal SCK1 is the high-level signal, and the seventh scan transistor ST7 is turned off. The second scan transistor ST2, the fourth scan transistor ST4, the eighth scan transistor ST8, and the tenth scan transistor ST10 are turn off. The signal of the third clock signal terminal SCK3 is the low-level signal, and the first scan transistor ST1 and the third scan transistor ST3 are turned on. Under an action of the third scan capacitor SC3, the ninth scan transistor ST9 maintains a turned-on state, and the turned-on ninth scan transistor ST9 outputs a high-level signal of the first power supply terminal VGH, so a signal of the output terminal SOUT is still a high-level signal.

In a fourth stage C4, a signal of the first clock signal terminal SCK1 is a low-level signal and a signal of the third clock signal terminal SCK3 is a high-level signal. The signal of the third clock signal terminal SCK3 is the high-level signal, and the first scan transistor ST1 and the third scan transistor ST3 are turned off. The signal of the first clock signal terminal SCK1 is at a low level, and the seventh scan transistor ST7 is turned on. Due to a storage effect of the third scan capacitor SC3, the first node S1 and the third node S3 maintain a high-level signal of a previous stage, so that the second scan transistor ST2, the fourth scan transistor ST4, the eighth scan transistor ST8, and the tenth scan transistor ST10 are turned off. Due to a storage effect of the first scan capacitor SC1, the fourth node S4 continues to be kept at a low level of the previous stage, so that the fifth scan transistor ST5 and the sixth scan transistor ST6 are turned on. In addition, the low-level signal of the first clock signal terminal SCK1 is transmitted to the seventh node S7 through the turned-on sixth scan transistor ST6 and the seventh scan transistor ST7, and the turned-on ninth scan transistor ST9 outputs a high-level signal of the first power supply terminal VGH, so a signal of the output terminal SOUT is still a high-level signal.

In a fifth stage C5, a signal of the first clock signal terminal SCK1 is a high-level signal and a signal of the third clock signal terminal SCK3 is a low-level signal. The signal of the third clock signal terminal SCK3 is the low-level signal, and the first scan transistor ST1 and the third scan transistor ST3 are turned on. The signal of the first clock signal terminal SCK1 is the high-level signal, and the seventh scan transistor ST7 is turned off. The turned-on first scan transistor ST1 transmits a low-level signal of the input terminal SIN to the first node S1, so that a level of the first node S1 is changed to be a low level, the turned-on twelfth scan transistor ST12 transmits a low-level signal of the first node S1 to the third node S3, so that a level of the third node S3 is changed to be a low level, and the second scan transistor ST2, the fourth scan transistor ST4, the eighth scan transistor ST8, and the tenth scan transistor ST10 are turned on. The turned-on second scan transistor ST2 transmits a signal of the third clock signal terminal SCK3 with a low level to the second node S2, thus a level of the second node S2 may be further lowered, so the second node S2 and the fourth node S4 continue to maintain a low level of a previous stage, so that the fifth scan transistor ST5 and the sixth scan transistor ST6 are turned on. The signal of the first clock signal terminal SCK1 is the high-level signal, and the seventh scan transistor ST7 is turned off. In addition, the turned-on eighth scan transistor ST8 transmits a high-level signal of the first power supply terminal VGH to the seventh node S7, and the ninth scan transistor ST9 is turned off. The turned-on tenth scan transistor ST10 outputs a low-level signal of the second power supply terminal VGL, so a signal of the output terminal SOUT is changed to be at a low level.

Figure 11A:
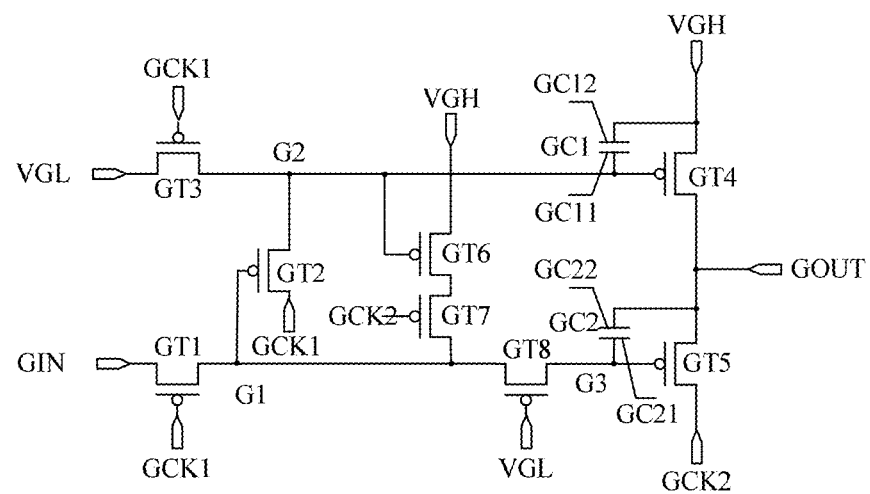
FIG. 11A is an equivalent circuit diagram of a control shift register according to an exemplary embodiment.
Figure 11B:
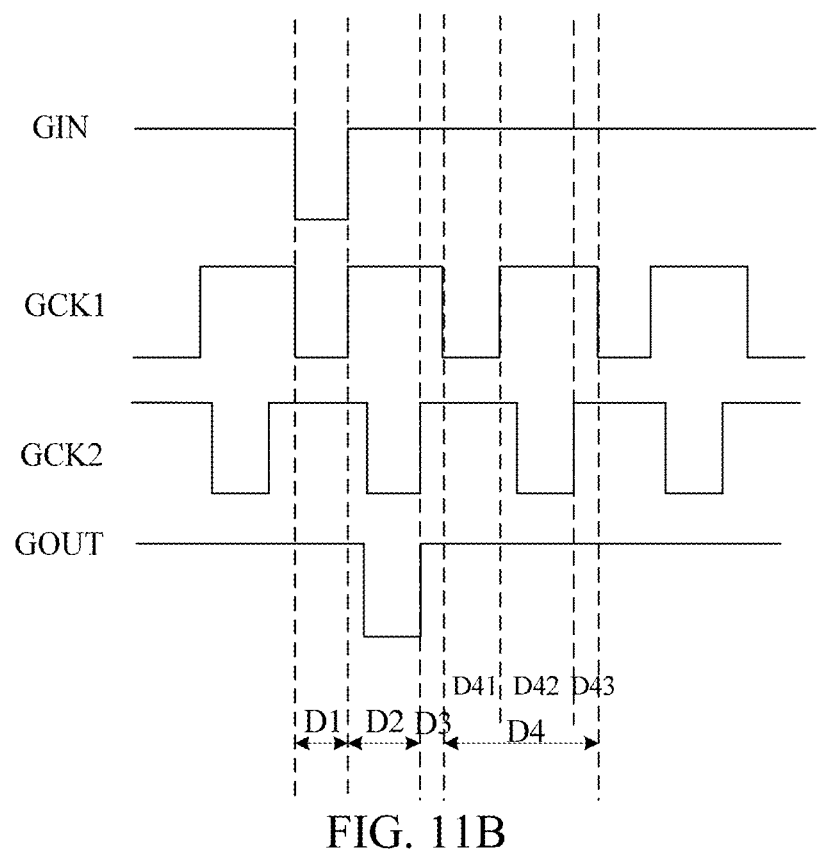
FIG. 11B is a timing diagram of the control shift register provided in FIG. 11A.

FIG. 11A is an equivalent circuit diagram of a control shift register according to an exemplary embodiment, and FIG. 11B is a timing diagram of the control shift register provided in FIG. 11A. As shown in FIG. 11A and FIG. 11B, as shown in FIG. 11B, the control shift register includes a first control transistor GT1 to an eighth control transistor GT8, a first control capacitor GC1, and a second control capacitor GC2.

In an exemplary embodiment, a control electrode of the first control transistor GT1 is electrically connected with a first clock signal terminal GCK1, a first electrode of the first control transistor GT1 is electrically connected with an input terminal GIN, a second electrode of the first control transistor GT1 is electrically connected with a first node G1; a control electrode of the second control transistor GT2 is electrically connected with the first node G1, a first electrode of the second control transistor GT2 is electrically connected with the first clock signal terminal GCK1, a second electrode of the second control transistor GT2 is electrically connected with a second node G2; a control electrode of the third control transistor GT3 is electrically connected with the first clock signal terminal GCK1, a first electrode of the third control transistor GT3 is electrically connected with a second power supply terminal VGL, a second electrode of the third control transistor GT3 is electrically connected with the second node G2; a control electrode of the fourth control transistor GT4 is electrically connected with the second node G2, a first electrode of the fourth control transistor GT4 is electrically connected with a first power supply terminal VGH, a second electrode of the fourth control transistor GT4 is electrically connected with an output terminal GOUT; a control electrode of the fifth control transistor GT5 is electrically connected with a third node G3, a first electrode of the fifth control transistor GT5 is electrically connected with a second clock signal terminal GCK2, a second electrode of the fifth control transistor GT5 is electrically connected with the output terminal GOUT; a control electrode of the sixth control transistor GT6 is electrically connected with the second node G2, a first electrode of the sixth control transistor GT6 is electrically connected with the first power supply terminal VGH, a second electrode of the sixth control transistor GT6 is electrically connected a first electrode of the seventh control transistor GT7; a control electrode of the seventh control transistor GT7 is electrically connected with the second clock signal terminal GCK2, a second electrode of the seventh control transistor GT7 is electrically connected with the first node G1; a control electrode of the eighth control transistor GT8 is electrically connected with the second power supply terminal VGL, a first electrode of the eighth control transistor GT8 is electrically connected with the first node G1, a second electrode of the eighth control transistor GT8 is electrically connected with the third node G3; a first electrode plate GC11 of the first control capacitor GC1 is electrically connected with the first power supply terminal VGH, and a second electrode plate GC12 of the first control capacitor GC1 is electrically connected with the second node G2; a first electrode plate GC21 of the second control capacitor GC2 is electrically connected with the output terminal GOUT, and a second electrode plate GC22 of the second control capacitor GC2 is electrically connected with the third node G3.

In an exemplary embodiment, the first control transistor GT1 to the eighth control transistor GT8 may be P-type transistors or may be N-type transistors.

In an exemplary embodiment, the first power supply terminal VGH continuously provides a high-level signal, and the second power supply terminal VGL continuously provides a low-level signal.

Taking the first control transistor GT1 to the eighth control transistor GT8 being P-type transistors as an example, as shown in FIG. 11B, a working process of a control shift register according to an exemplary embodiment includes following stages.

In an input stage D1, signals of the first clock signal terminal GCK1 and the input terminal GIN are low-level signals, and a signal of the second clock signal terminal GCK2 is a high-level signal. Since a signal of the first clock signal terminal GCK1 is a low-level signal, the first control transistor GT1 is turned on, and a signal of the input terminal GIN is transmitted to the first node G1 via the first control transistor GT1. Since the eighth control transistor GT8 receives a low-level signal of the second power supply terminal VGL, the eighth control transistor GT8 is in a turned-on state. A level of the third node G3 may control the fifth control transistor GT5 to be turned on, and the signal of the second clock signal terminal GCK2 is transmitted to the output terminal GOUT via the fifth control transistor GT5, that is, in the input stage D1, the output terminal GOUT has a signal of the second clock signal terminal GCK2 of a high-level signal. In addition, since the signal of the first clock signal terminal GCK1 is the low-level signal, the third control transistor GT3 is turned on, and the low-level signal of the second power supply terminal VGL is transmitted to the second node G2 via the third control transistor GT3. At this point, both the fourth control transistor GT4 and the sixth control transistor GT6 are turned on. Since the signal of the second clock signal terminal GCK2 is the high-level signal, the seventh control transistor GT7 is turned off.

In an output stage D2, a signal of the first clock signal terminal GCK1 is a high-level signal, a signal of the second clock signal terminal GCK2 is a low-level signal, and a signal of the input terminal GIN is a high-level signal. The fifth control transistor GT5 is turned on, and the signal of the second clock signal terminal GCK2 is used as a signal of the output terminal GOUT via the fifth control transistor GT5. In the output stage D2, a level of one terminal of the second control capacitor GC2 connected with the output terminal OUT is changed to be a signal of the second power supply terminal VGL. Due to a bootstrap function of the second control capacitor GC2, the eighth control transistor GT8 is turned off, the fifth control transistor GT5 may be turned on better, and the signal of the output terminal GOUT is a low-level signal. In addition, the signal of the first clock signal terminal GCK1 is the high-level signal, so that both the first control transistor GT1 and the third control transistor GT3 are turned off. The second control transistor GT2 is turned on, and the high-level signal of the first clock signal terminal GCK1 is transmitted to the second node G2 via the second control transistor GT2, so that both the fourth control transistor GT4 and the sixth control transistor GT6 are turned off. Since the signal of the second clock signal terminal GCK2 is the low-level signal, the seventh control transistor GT7 is turned on.

In a buffer stage D3, signals of the first clock signal terminal GCK1 and the second clock signal terminal GCK2 are both high-level signals, a signal of the input terminal GIN is a high-level signal, the fifth control transistor GT5 is turned on, and a signal of the second clock signal terminal GCK2 is used as a signal of the output terminal GOUT via the fifth control transistor GT5. Due to a bootstrap function of the second control capacitor C2, a level of the first node G1 is changed to be VGL-VthN1. In addition, a signal of the first clock signal terminal GCK1 is a high-level signal, so that the first control transistor GT1 and the third control transistor GT3 are both turned off, the eighth control transistor GT8 is turned on, the second control transistor GT2 is turned on, and the high-level signal of the first clock signal terminal GCK1 is transmitted to the second node G2 via the second control transistor GT2, thus both the fourth control transistor GT4 and the sixth control transistor GT6 are turned off. Since a signal of the second clock signal terminal GCK2 is a high-level signal, the seventh control transistor GT7 is turned off.

In a first sub-stage D41 of a stabilization stage D4, a signal of the first clock signal terminal GCK1 is a low-level signal, and signals of the second clock signal terminal GCK2 and the input terminal GIN are high-level signals. Since the signal of the first clock signal terminal GCK1 is the low-level signal, the first control transistor GT1 is turned on, and a signal of the input terminal GIN is transmitted to the first node G1 via the first control transistor GT1, and the second control transistor GT2 is turned off. Since the eighth control transistor GT8 is in a turned-on state, the fifth control transistor GT5 is turned off. Since the signal of the first clock signal terminal GCK1 is at a low level, the third control transistor GT3 is turned on, the fourth control transistor GT4 and the sixth control transistor GT6 are both turned on, and a high-level signal of the first power supply terminal VGH is transmitted to the output terminal GOUT via the fourth control transistor GT4, that is, a signal of the output terminal GOUT is a high-level signal.

In a second sub-stage D42 of the stabilization stage D4, a signal of the first clock signal terminal GCK1 is a high-level signal, a signal of the second clock signal terminal GCK2 is a low-level signal, and a signal of the input terminal GIN is a high-level signal. Both the fifth control transistor GT5 and the second control transistor GT2 are turned off. The signal of the first clock signal terminal GCK1 is the high-level signal, so that the first control transistor GT1 and the third control transistor GT3 are both turned off. Under a holding function of the first control capacitor GC1, the fourth control transistor GT4 and the sixth control transistor GT6 are both turned on, and a high-level signal is transmitted to the output terminal GOUT via the fourth control transistor GT4, that is, a signal of the output terminal GOUT is a high-level signal.

In the second sub-stage D42, since the signal of the second clock signal terminal GCK2 is the low-level signal, the seventh control transistor GT7 is turned on, so that a high-level signal is transmitted to the third node G3 and the first node G1 via the sixth control transistor GT6 and the seventh control transistor GT7, so that signals of the third node G3 and the first node G1 are kept as high-level signals.

In a third sub-stage D43, signals of the first clock signal terminal GCK1 and the second clock signal terminal GCK2 are both high-level signals, and a signal of the input terminal GIN is a high-level signal. The fifth control transistor GT5 and the second control transistor GT2 are turned off. The signal of the first clock signal terminal GCK1 is the high-level signal, so that the first control transistor GT1 and the third control transistor GT3 are both turned off, and the fourth control transistor GT4 and the sixth control transistor GT6 are both turned on. A high-level signal is transmitted to the output terminal GOUT via the fourth control transistor GT4, that is, a signal of the output terminal GOUT is a high-level signal.

In an exemplary embodiment, a circuit structure layer may include a semiconductor layer, a first insulation layer, a first conductive layer, a second insulation layer, a second conductive layer, a third insulation layer, a third conductive layer, a fourth insulation layer, a fourth conductive layer, a fifth insulation layer, and a fifth conductive layer stacked sequentially on a base substrate.

In an exemplary embodiment, a first conductive layer may include a reset signal line, a light emitting signal line, a scan signal line, and a control signal line.

In an exemplary embodiment, a second conductive layer may include a first initial signal line, a second initial signal line, and a scan connection part S_CN.

In an exemplary embodiment, a third conductive layer may include a light emitting connection part EM_CN.

In an exemplary embodiment, a fourth conductive layer may include a reset transfer line RST_TL, a first initial output line INIT1_OL, a light emitting output line EM_OL, a scan output line S_OL, and a control output line G_OL.

In an exemplary embodiment, a fifth conductive layer may include a reset connection line RST_CL, a first initial connection line INIT1_CL, a light emitting connection line EM_CL, a scan connection line S_CL, a control connection line G_CL, a second initial connection line INIT2_CL, a first initial power supply line INIT1_SL, and a second initial power supply line INIT2_SL.

In an exemplary embodiment, a reset output line RST_OL may be located in a first conductive layer or may be located in a second conductive layer, which is not limited in present disclosure.

In an exemplary embodiment, since a reset output line is located in a first conductive layer or a second conductive layer, a reset transfer line and a reset connection line are located in a fourth conductive layer and a fifth conductive layer, and multiple conductive layers are spaced between, the reset transfer line and the reset connection line, and the reset output line, a distance between, the reset transfer line and the reset connection line, and the reset output line, is relatively long, a problem of signal crosstalk caused by signal line overlap may be avoided, and a display effect of a display substrate may be improved.

In an exemplary embodiment, a low-level power supply line VSSL may be located in a fourth conductive layer, or may be located in a fifth conductive layer, or may be located in both a fourth conductive layer and a fifth conductive layer, which is not limited in present disclosure.

A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and inkjet printing. Etching may be any one or more of dry etching and wet etching, which is not limited in present disclosure. A "thin film" refers to a layer of thin film made of a material on a base substrate using deposition, coating, or another process. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern". "A and B being arranged in a same layer" mentioned in the present disclosure means that A and B are formed simultaneously through a same patterning process, and a "thickness" of a film layer is a dimension of the film layer in a direction perpendicular to a display substrate. In an exemplary embodiment of the present disclosure, "an orthographic projection of B is within a range of an orthographic projection of A" refers to that a boundary of the orthographic projection of B falls within a range of a boundary of the orthographic projection of A, or a boundary of the orthographic projection of A is overlapped with a boundary of the orthographic projection of B.

A display substrate according to an exemplary embodiment is illustrated below by taking a case that a reset output line is located in a first conductive layer as an example through a preparation process of the display substrate.

Figure 12:
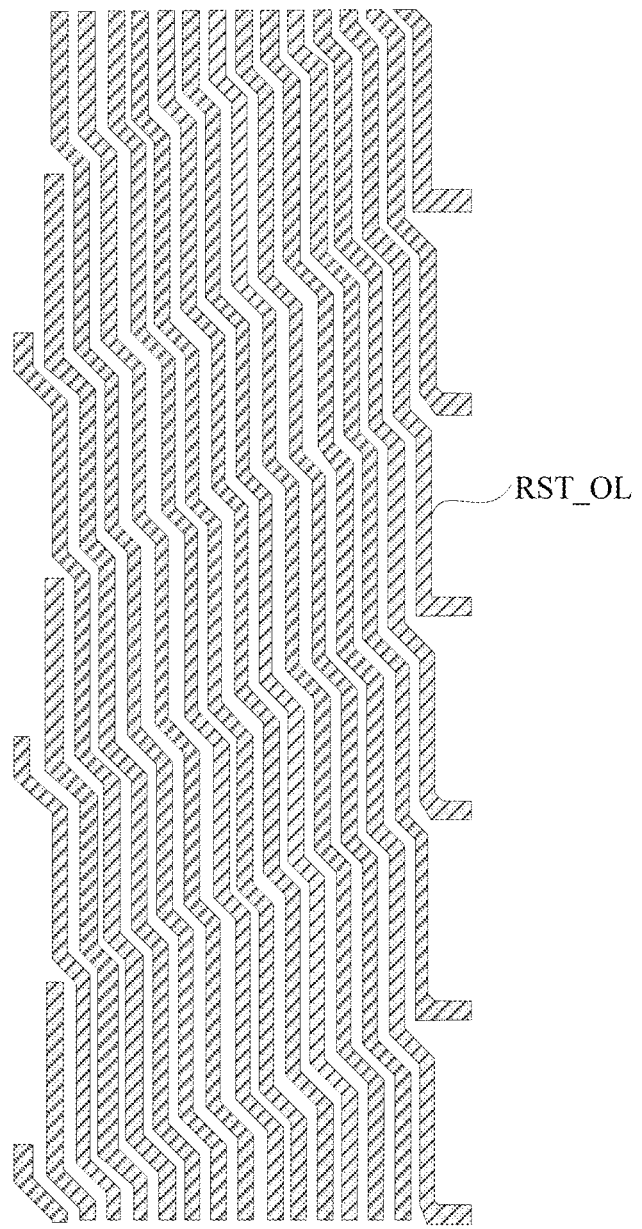
FIG. 12 is a schematic diagram of a structure of a first conductive layer of a bezel region.
Figure 13:
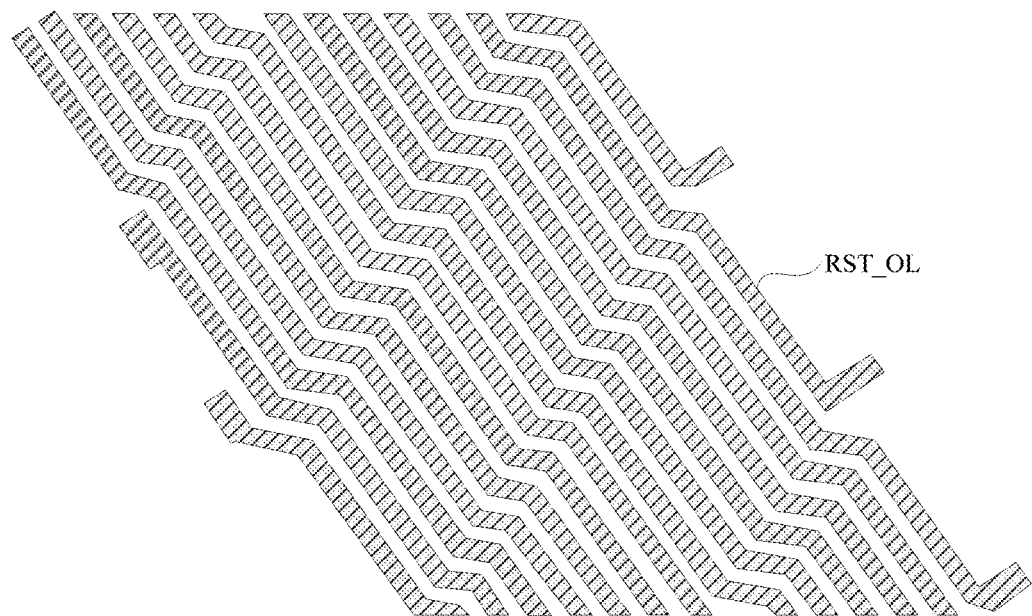
FIG. 13 is a schematic diagram of a structure of a first conductive layer of a rounded corner region.
Figure 14:
FIG. 14 is a schematic diagram of a structure of a second conductive layer of a bezel region.
Figure 14:
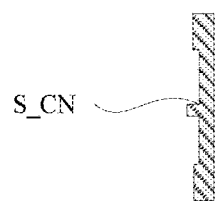

(1) Forming a first conductive layer on a base substrate, which includes: depositing a semiconductor thin film on the base substrate, patterning the semiconductor thin film through a patterning process to form a semiconductor layer, depositing a first insulation thin film on the base substrate on which the semiconductor layer is formed, patterning the first insulation thin film through a patterning process to form a first insulation layer, depositing a first conductive thin film on the first insulation layer, and patterning the first conductive thin film through a patterning process to form the first conductive layer, as shown in FIG. 12 and FIG. 13, FIG. 12 is a schematic diagram of a structure of a first conductive layer of a bezel region, and FIG. 13 is a schematic diagram of a structure of a first conductive layer of a rounded corner region.

In an exemplary embodiment, the first conductive layer may include a reset signal line, a light emitting signal line, a scan signal line, a control signal line, and a reset output line RST_OL.

Figure 15:
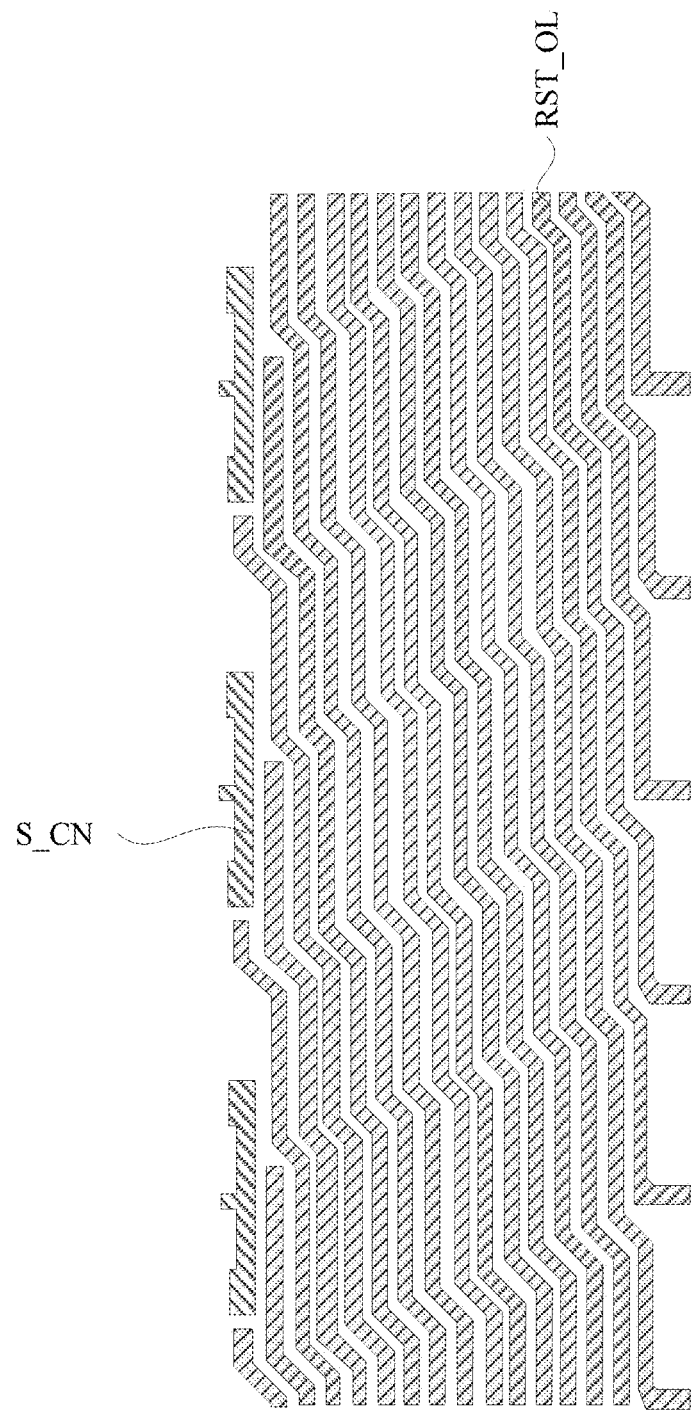
FIG. 15 is a schematic diagram of a structure of a bezel region after a second conductive layer is formed.
Figure 16:
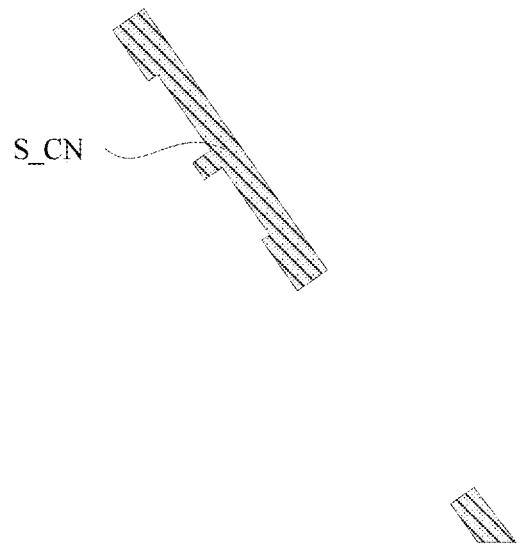
FIG. 16 is a schematic diagram of a structure of a second conductive layer of a rounded corner region.
Figure 17:
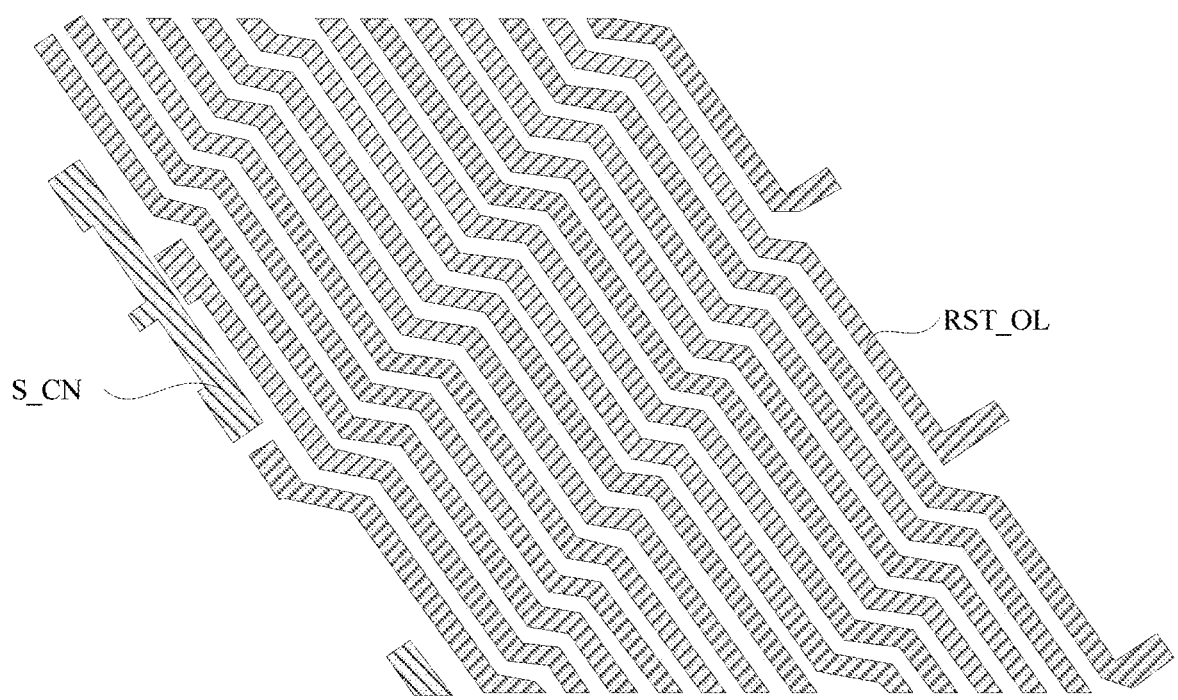
FIG. 17 is a schematic diagram of a structure of a rounded corner region after a second conductive layer is formed.
Figure 18:
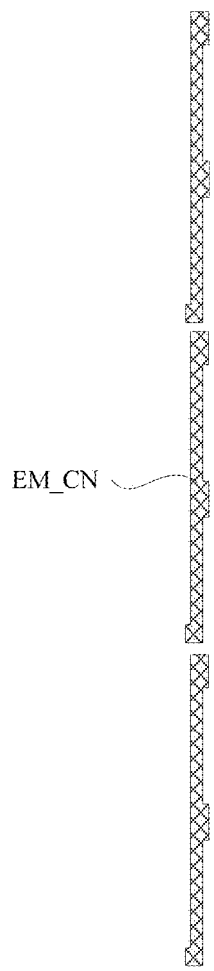
FIG. 18 is a schematic diagram of a structure of a third conductive layer of a bezel region.

(2) Forming a second conductive layer, which includes: depositing a second insulation thin film on the base substrate on which the first conductive layer is formed, patterning the second insulation thin film through a patterning process to form a second insulation layer, depositing a second conductive thin film on the base substrate on which the second insulation layer is formed, and patterning the second conductive thin film through a patterning process to form the second conductive layer, as shown in FIGS. 14 to 17, FIG. 14 is a schematic diagram of a structure of a second conductive layer of a bezel region, FIG. 15 is a schematic diagram of a structure of a bezel region after a second conductive layer is formed, FIG. 16 is a schematic diagram of a structure of a second conductive layer of a rounded corner region, and FIG. 17 is a schematic diagram of a structure of a rounded corner region after a second conductive layer is formed.

In an exemplary embodiment, the second conductive layer may include a first initial signal line, a second initial signal line, and a scan connection part S_CN.

Figure 19:
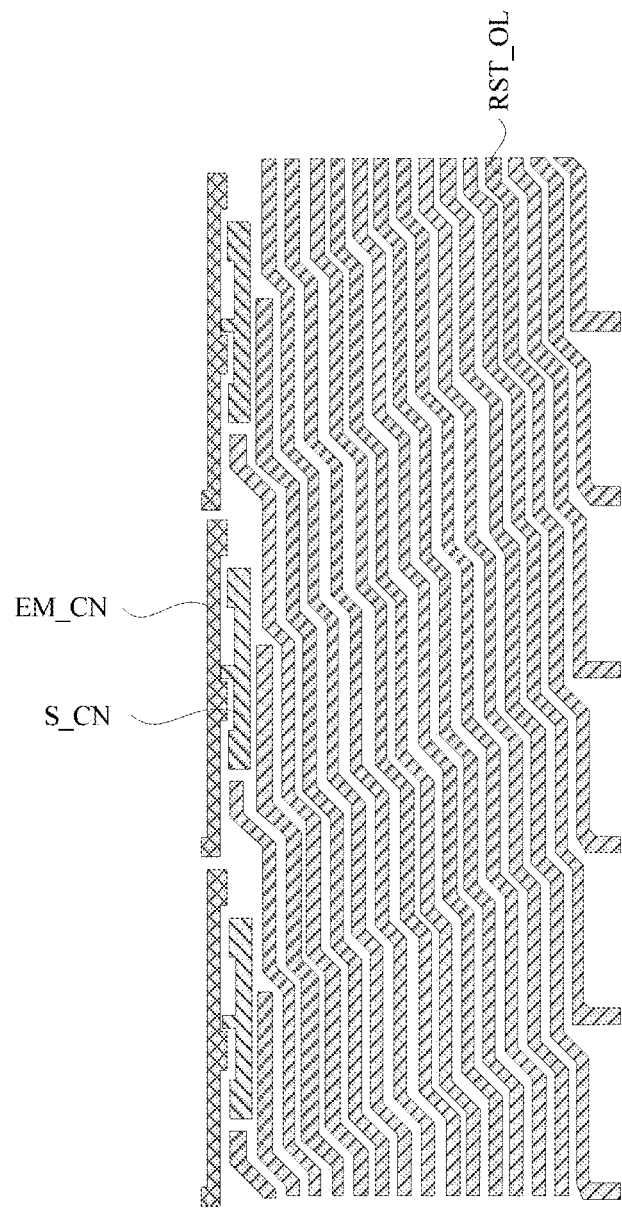
FIG. 19 is a schematic diagram of a structure of a bezel region after a third conductive layer is formed.
Figure 20:
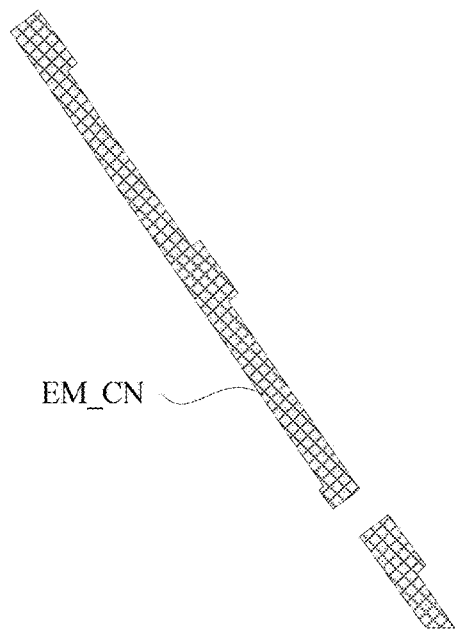
FIG. 20 is a schematic diagram of a structure of a third conductive layer of a rounded corner region.
Figure 21:
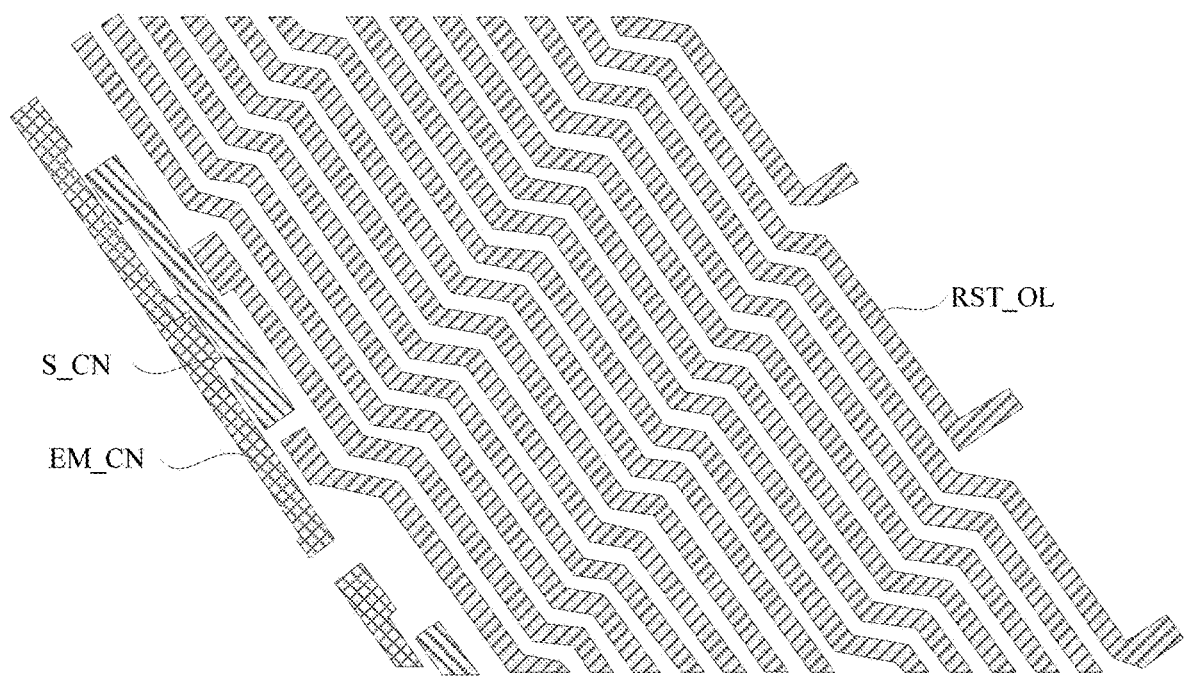
FIG. 21 is a schematic diagram of a structure of a rounded corner region after a third conductive layer is formed.
Figure 22:
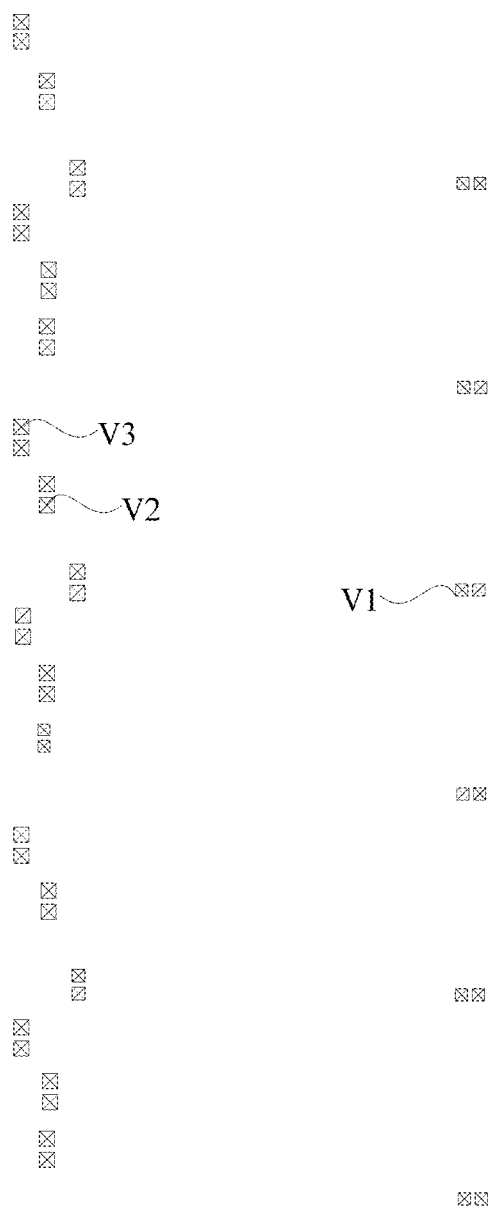
FIG. 22 is a schematic diagram of a structure of a fourth insulation layer of a bezel region.

(3) Forming a third conductive layer, which includes: depositing a third insulation thin film on the base substrate on which the second conductive layer is formed, patterning the third insulation thin film through a patterning process to form a third insulation layer, depositing a third conductive thin film on the third insulation layer, patterning the third conductive thin film through a patterning process to form the third conductive layer, as shown in FIG. 18 to FIG. 21, FIG. 18 is a schematic diagram of a structure of a third conductive layer of a bezel region, FIG. 19 is a schematic diagram of a structure of a bezel region after a third conductive layer is formed, FIG. 20 is a schematic diagram of a structure of a third conductive layer of a rounded corner region, and FIG. 21 is a schematic diagram of a structure of a rounded corner region after a third conductive layer is formed.

In an exemplary embodiment, the third conductive layer may include a light emitting connection part EM_CN.

Figure 23:
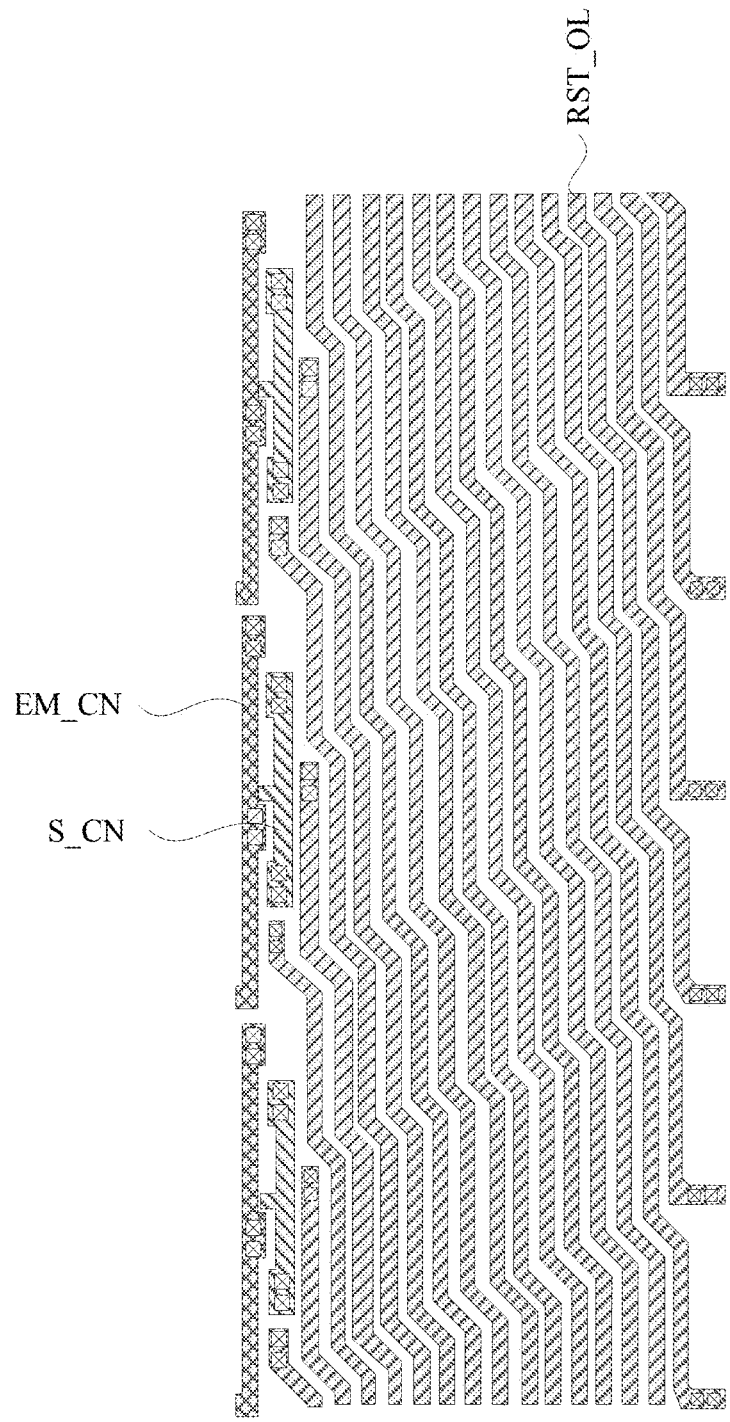
FIG. 23 is a schematic diagram of a structure of a bezel region after a fourth insulation layer is formed.
Figure 24:
FIG. 24 is a schematic diagram of a structure of a fourth insulation layer of a rounded corner region.
Figure 25:
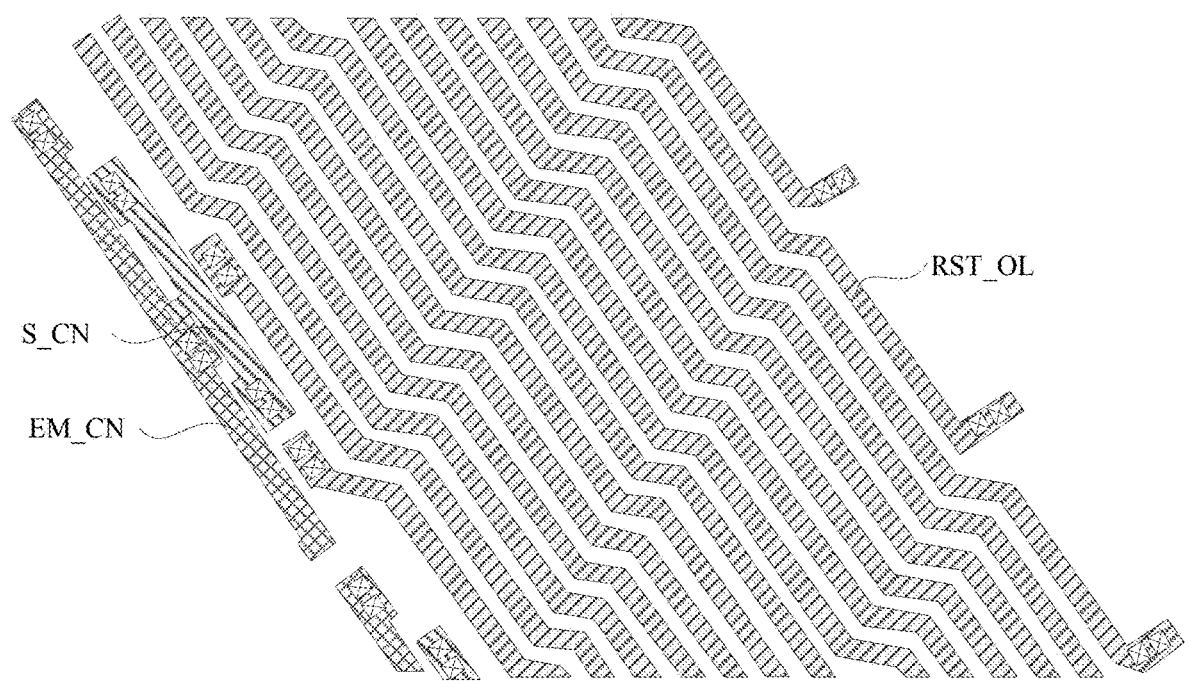
FIG. 25 is a schematic diagram of a structure of a rounded corner region after a fourth insulation layer is formed.
Figure 26:
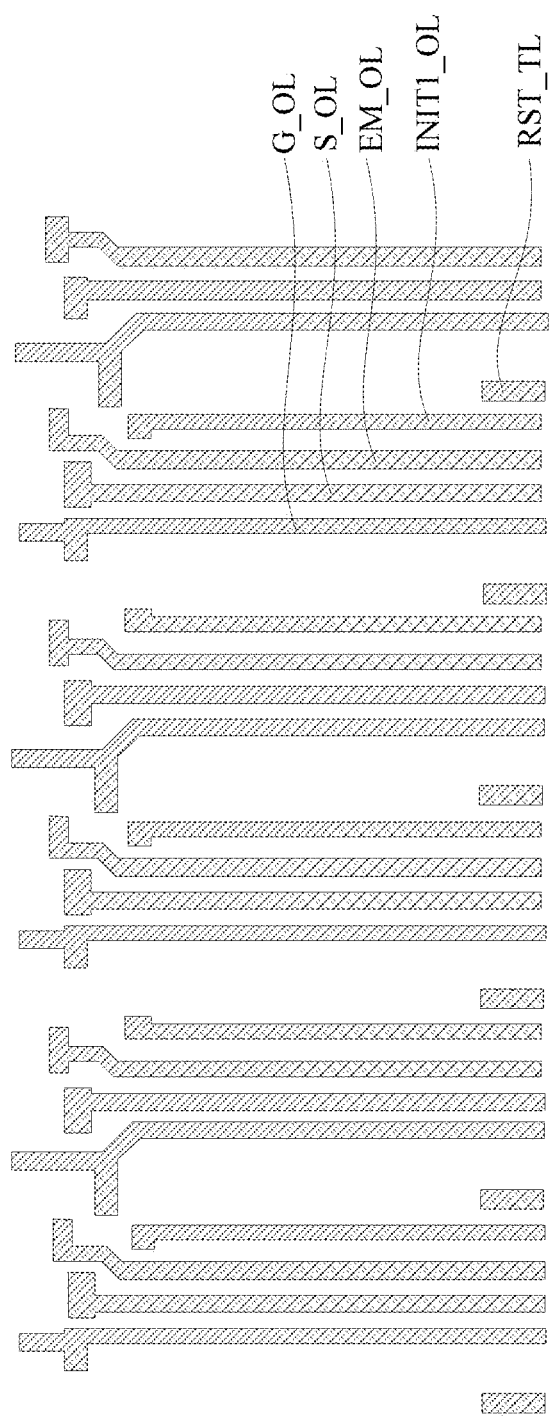
FIG. 26 is a schematic diagram of a structure of a fourth conductive layer of a bezel region.

(4) Forming a fourth insulation layer, which includes: depositing a fourth insulation thin film on the base substrate on which the third conductive layer is formed, patterning the fourth insulation thin film through a patterning process to form a fourth insulation layer, as shown in FIG. 22 to FIG. 25, FIG. 22 is a schematic diagram of a structure of a fourth insulation layer of a bezel region, FIG. 23 is a schematic diagram of a structure of a bezel region after a fourth insulation layer is formed, FIG. 24 is a schematic diagram of a structure of a fourth insulation layer of a rounded corner region, and FIG. 25 is a schematic diagram of a structure of a rounded corner region after a fourth insulation layer is formed.

In an exemplary embodiment, the fourth insulation layer includes a plurality of via patterns. The plurality of via patterns include a first via V1 penetrating through the second insulation layer to the fourth insulation layer, a second via V2 penetrating through the third insulation layer and the fourth insulation layer, and a third via V3 opened on the fourth insulation layer, wherein the first via V1 exposes a reset output line, the second via V2 exposes a scan connection part, and the third via V3 exposes a light emitting connection part.

Figure 27:
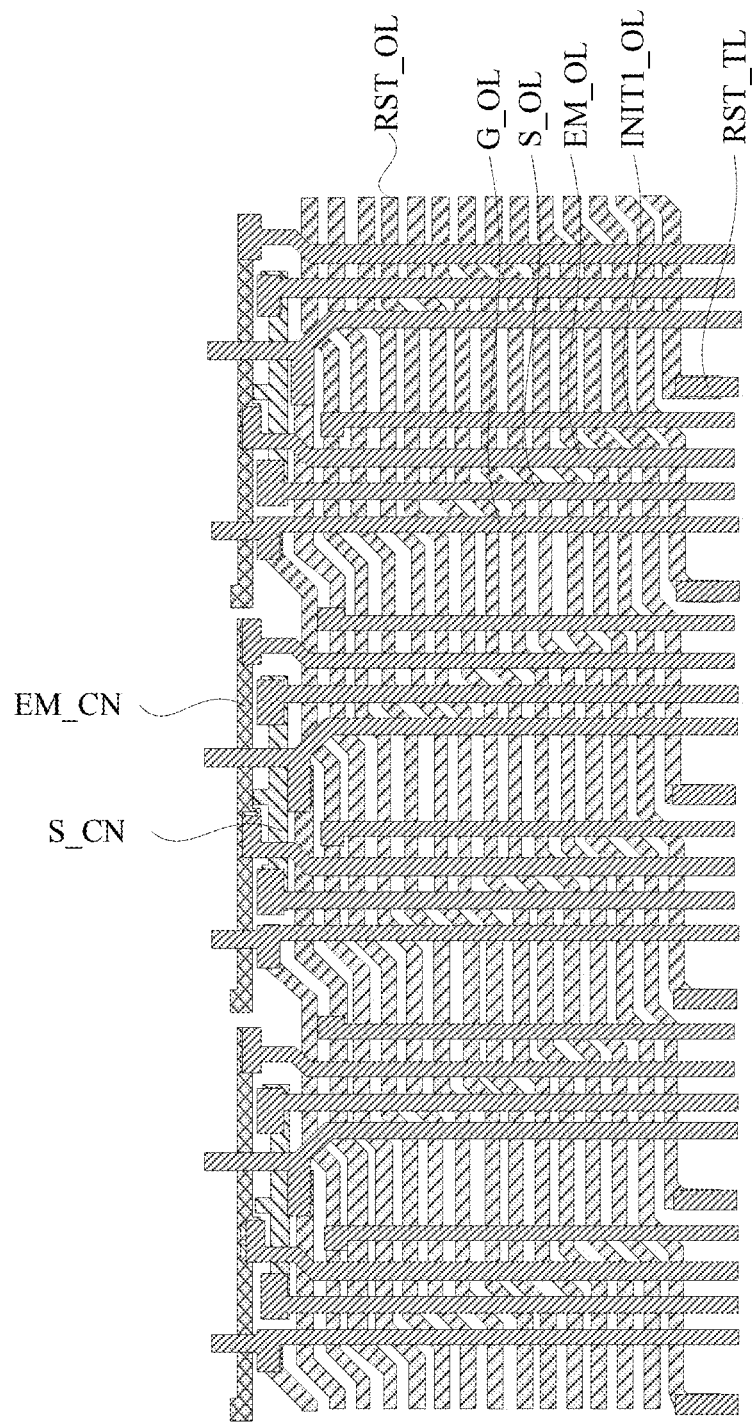
FIG. 27 is a schematic diagram of a structure of a bezel region after a fourth conductive layer is formed.
Figure 28:
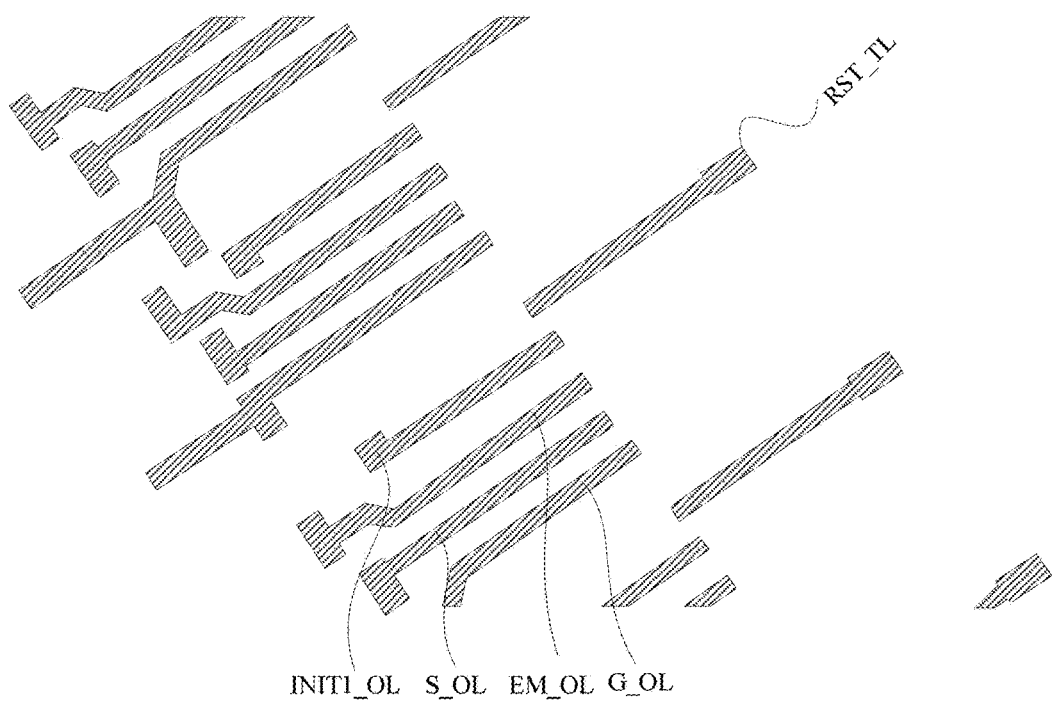
FIG. 28 is a schematic diagram of a structure of a fourth conductive layer of a rounded corner region.
Figure 29:
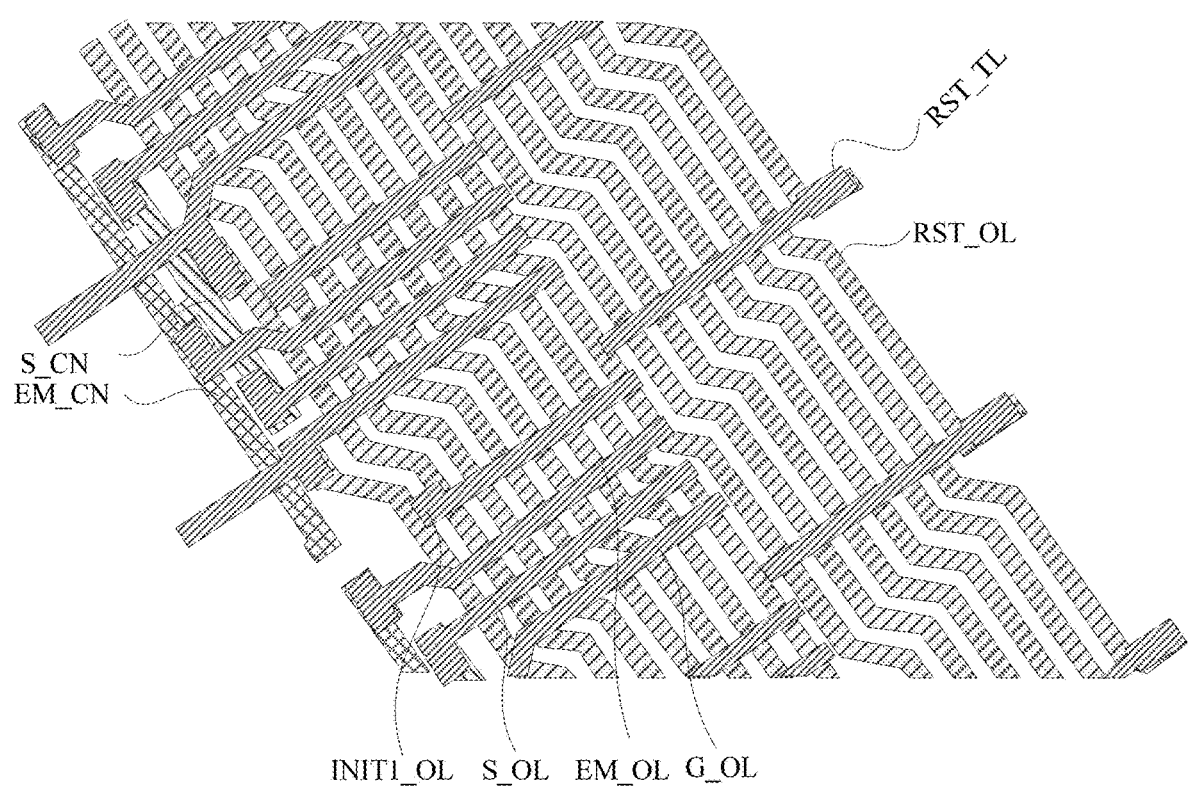
FIG. 29 is a schematic diagram of a structure of a rounded corner region after a fourth conductive layer is formed.
Figure 30:
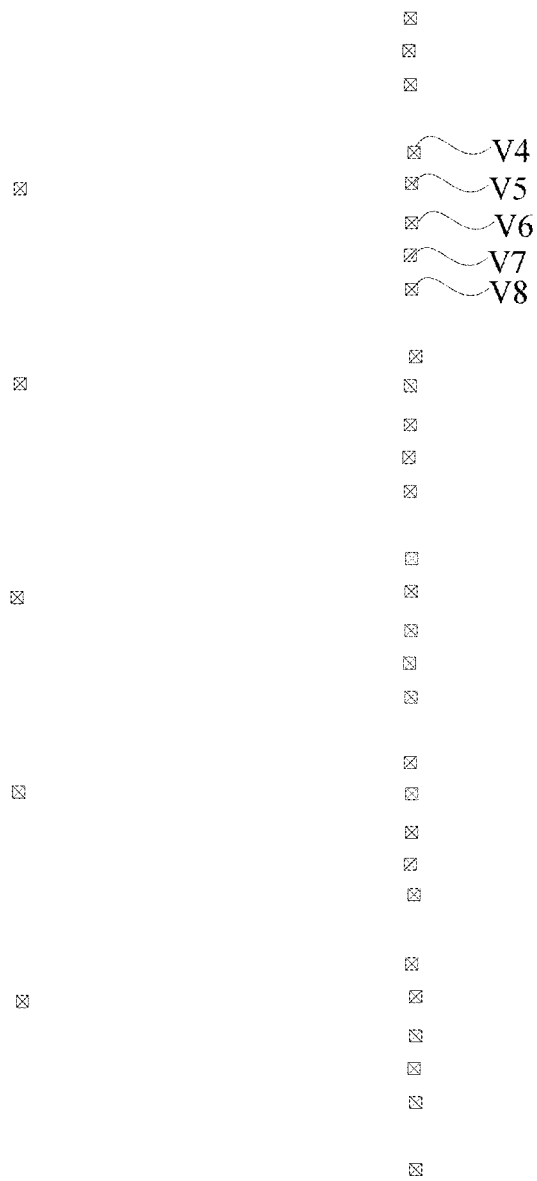
FIG. 30 is a schematic diagram of a structure of a fifth insulation layer of a bezel region.

(5) Forming a fourth conductive layer, which includes: depositing a fourth conductive thin film on the base substrate on which the fourth insulation layer is formed, patterning the fourth conductive thin film through a patterning process to form the fourth conductive layer, as shown in FIG. 26 to FIG. 29, FIG. 26 is a schematic diagram of a structure of a fourth conductive layer of a bezel region, FIG. 27 is a schematic diagram of a structure of a bezel region after a fourth conductive layer is formed, FIG. 28 is a schematic diagram of a structure of a fourth conductive layer of a rounded corner region, and FIG. 29 is a schematic diagram of a structure of a rounded corner region after a fourth conductive layer is formed.

In an exemplary embodiment, the fourth conductive layer may include a reset transfer line RST_TL, a first initial output line INIT1_OL, a light emitting output line EM_OL, a scan output line S_OL, and a control output line G_OL.

In an exemplary embodiment, a reset transfer line is electrically connected with a reset output line through a first via, a control output line electrically connected with a same control shift register is electrically connected with the reset output line through the first via, a scan output line is electrically connected with a scan connection part through a second via, and a light emitting output line is electrically connected with a light emitting connection part through a third via.

Figure 31:
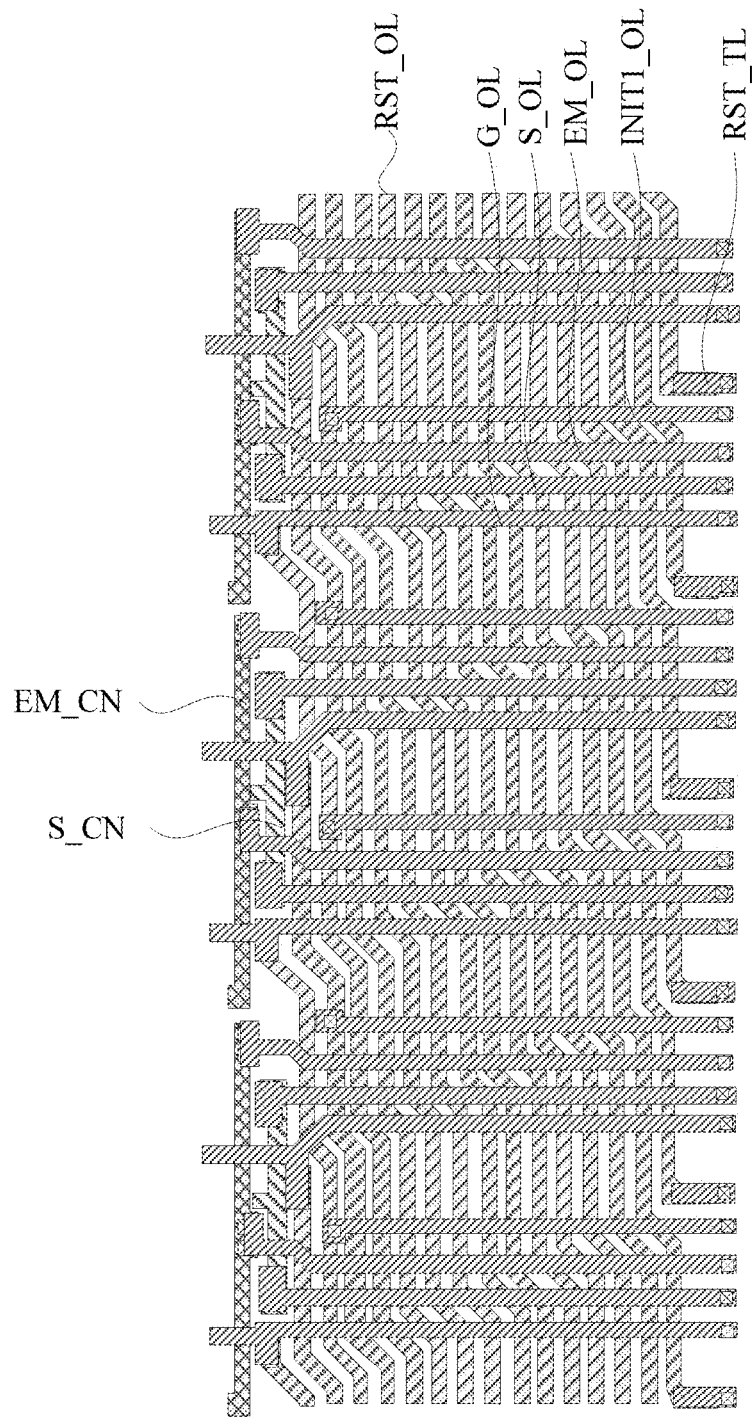
FIG. 31 is a schematic diagram of a structure of a bezel region after a fifth insulation layer is formed.
Figure 32:
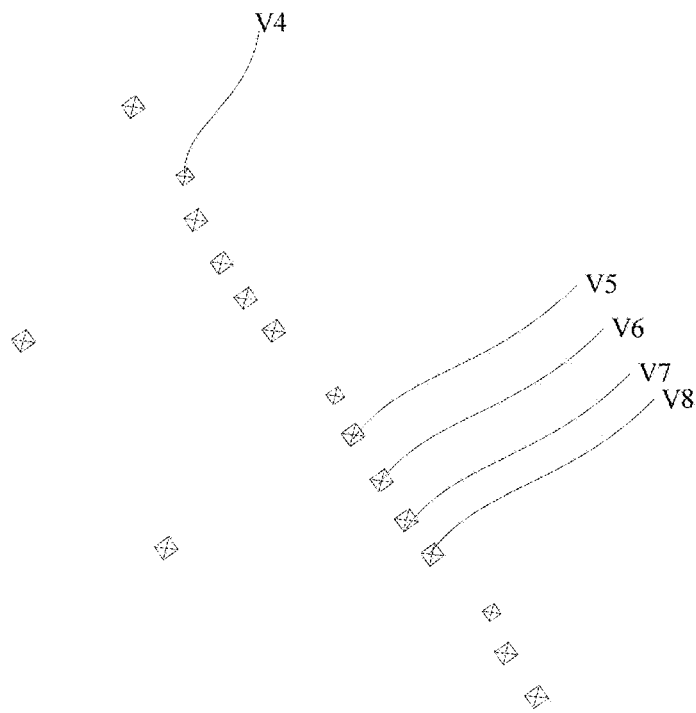
FIG. 32 is a schematic diagram of a structure of a fifth insulation layer of a rounded corner region.
Figure 33:
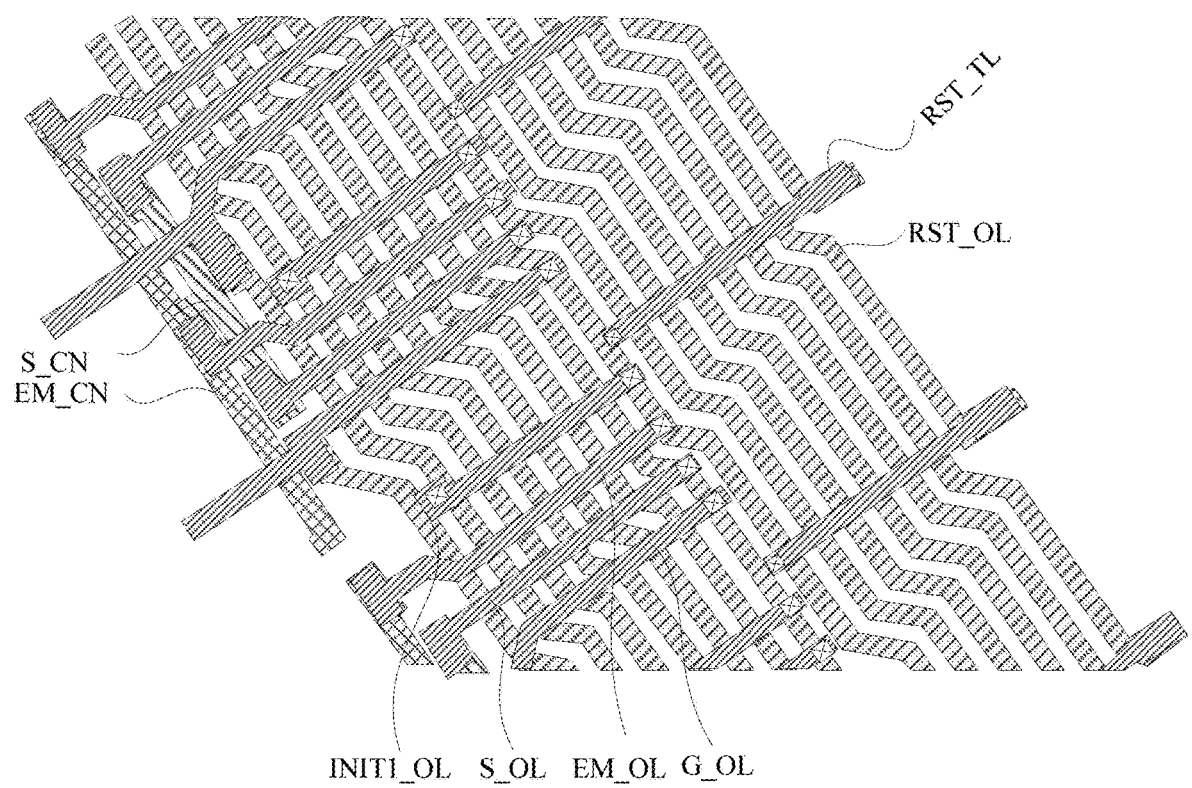
FIG. 33 is a schematic diagram of a structure of a rounded corner region after a fifth insulation layer is formed.
Figure 34:
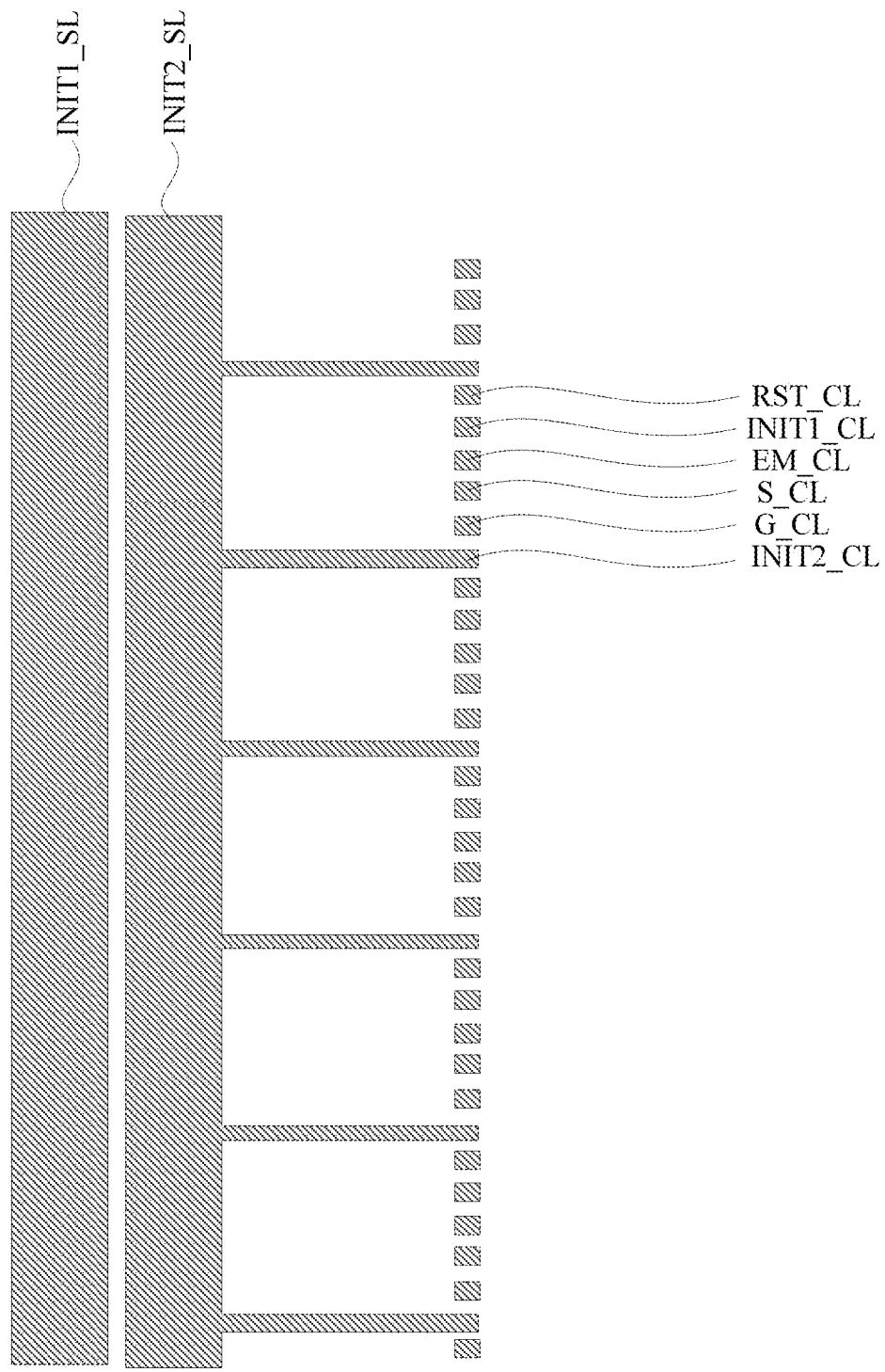
FIG. 34 is a schematic diagram of a structure of a fifth conductive layer of a bezel region.

(6) Forming a fifth insulation layer, which includes: depositing a fifth insulation thin film on the base substrate on which the fourth conductive layer is formed, patterning the fifth insulation thin film through a patterning process to form the fifth insulation layer, as shown in FIG. 30 to FIG. 33, FIG. 30 is a schematic diagram of a structure of a fifth insulation layer of a bezel region, FIG. 31 is a schematic diagram of a structure of a bezel region after a fifth insulation layer is formed, FIG. 32 is a schematic diagram of a structure of a fifth insulation layer of a rounded corner region, and FIG. 33 is a schematic diagram of a structure of a rounded corner region after a fifth insulation layer is formed.

In an exemplary embodiment, the fifth insulation layer includes a plurality of via patterns. The plurality of via patterns include a fourth via V4 to an eighth via V8 opened in the fifth insulation layer. Herein, the fourth via V4 exposes a reset transfer line, the fifth via V5 exposes a first initial output line, the sixth via V6 exposes a light emitting output line, the seventh via V7 exposes a scan output line, and the eighth via V8 exposes a control output line.

Figure 35:
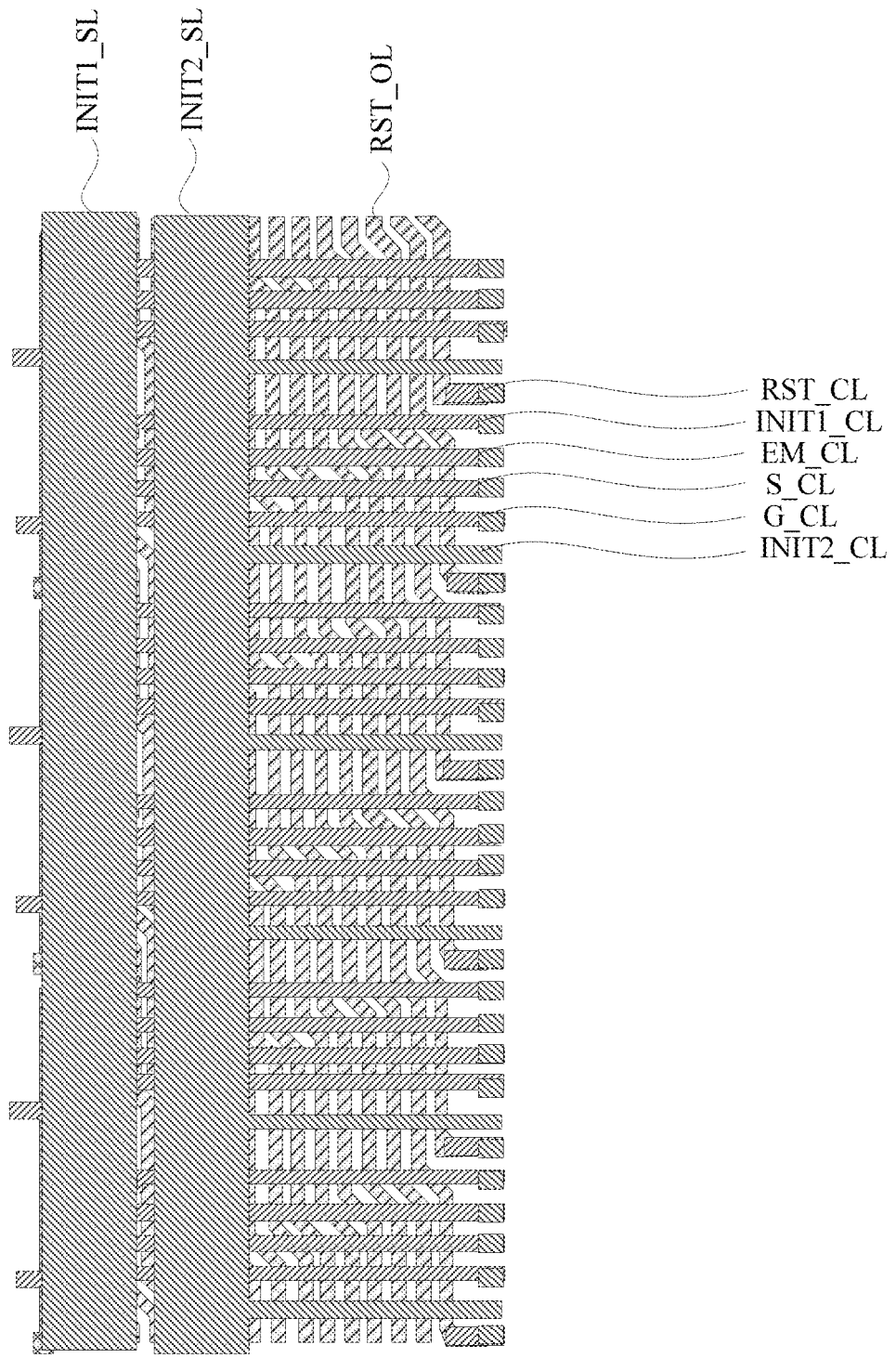
FIG. 35 is a schematic diagram of a structure of a bezel region after a fifth conductive layer is formed.
Figure 36:
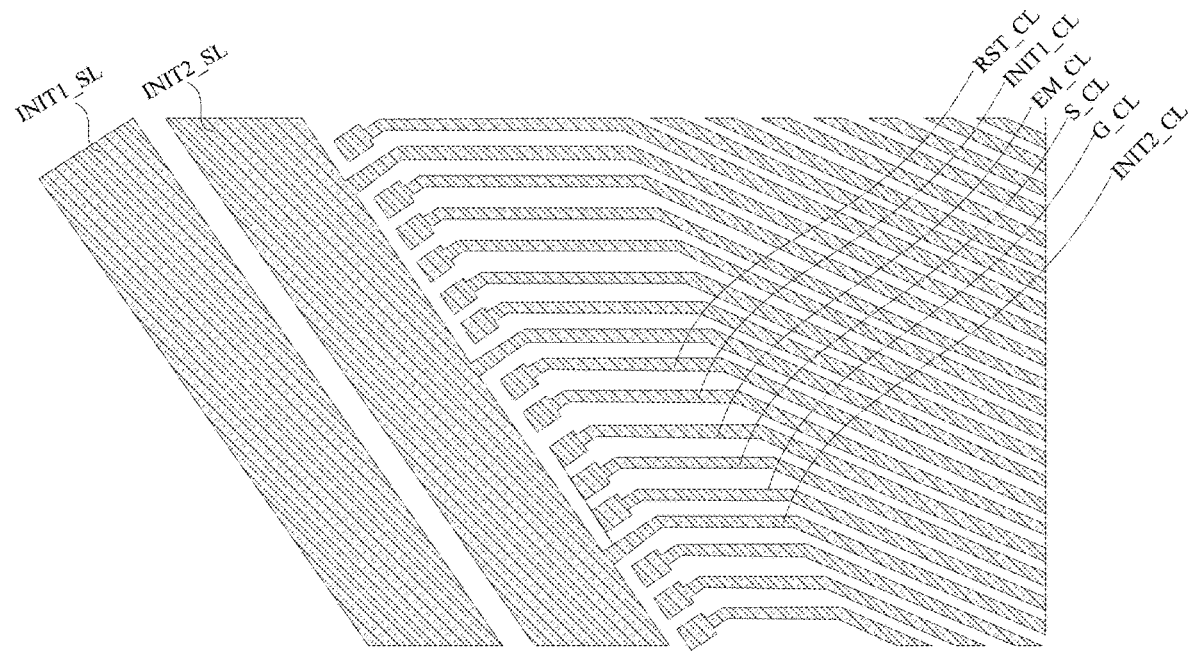
FIG. 36 is a schematic diagram of a structure of a fifth conductive layer of a rounded corner region.
Figure 37:
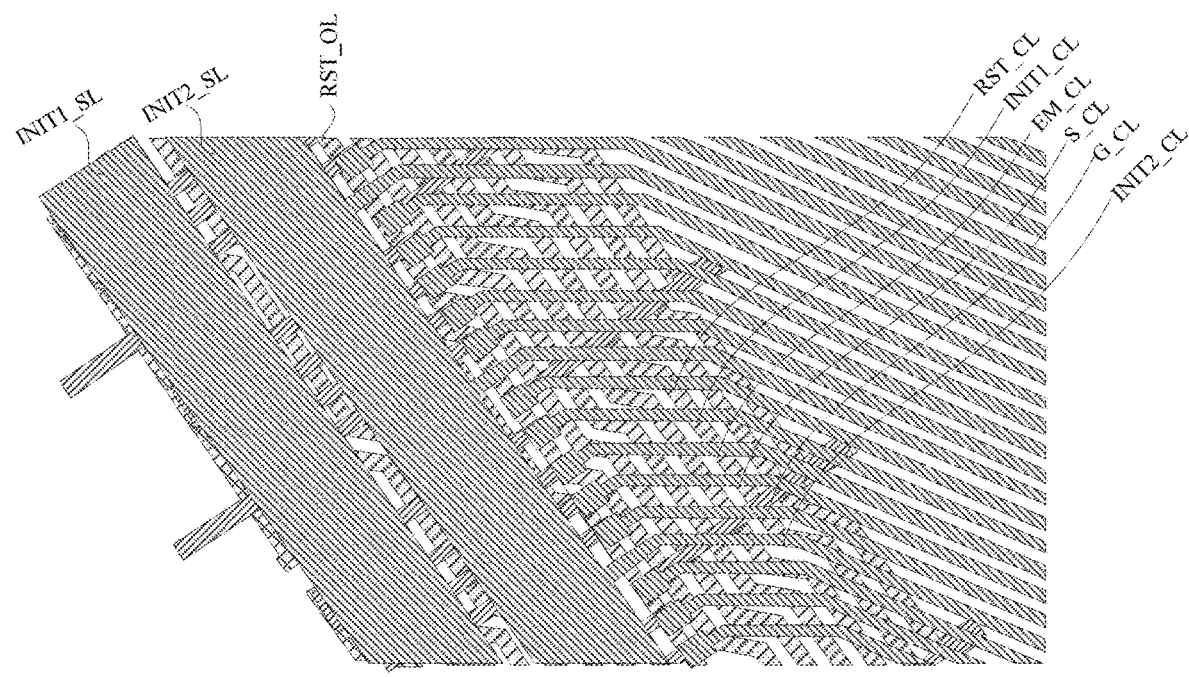
FIG. 37 is a schematic diagram of a structure of a rounded corner region after a fifth conductive layer is formed.

(7) Forming a fifth conductive layer, which includes: depositing a fifth conductive thin film on the base substrate on which the fifth insulation layer is formed, patterning the fifth conductive thin film through a patterning process to form the fifth conductive layer, as shown in FIG. 34 to FIG. 37, FIG. 34 is a schematic diagram of a structure of a fifth conductive layer of a bezel region, FIG. 35 is a schematic diagram of a structure of a bezel region after a fifth conductive layer is formed, FIG. 36 is a schematic diagram of a structure of a fifth conductive layer of a rounded corner region, and FIG. 37 is a schematic diagram of a structure of a rounded corner region after a fifth conductive layer is formed.

In an exemplary embodiment, the fifth conductive layer may include a reset connection line RST_CL, a first initial connection line INIT1_CL, a light emitting connection line EM_CL, a scan connection line S_CL, a control connection line G_CL, a second initial connection line INIT2_CL, a first initial power supply line INIT1_SL, and a second initial power supply line INIT2_SL.

In an exemplary embodiment, a reset connection line is electrically connected with a reset transfer line through a fourth via, a first initial power supply line and a first initial connection line are electrically connected with a first initial output line through a fifth via, a light emitting connection line is electrically connected with a light emitting output line through a sixth via, a scan connection line is electrically connected with a scan output line through a seventh via, and a control connection line is electrically connected with a control output line through an eighth via.

(8) Forming a planarization layer, which includes: coating a planarization thin film on the base substrate on which the fifth conductive layer is formed, patterning the planarization thin film through etching to form the planarization layer.

(9) Forming a light emitting element, which includes: depositing a transparent conductive thin film on the base substrate on which the planarization layer is formed, patterning the transparent conductive thin film through a patterning process to form an anode, depositing a pixel definition thin film on the base substrate on which the anode is formed, patterning the pixel definition thin film through a patterning process to form a pixel definition layer, depositing a cathode thin film on the base substrate on which the pixel definition layer is formed, and patterning the cathode thin film through a patterning process to form a cathode.

In an exemplary embodiment, the semiconductor layer may be a metal oxide layer. The metal oxide layer may be made of an oxide containing indium and tin, an oxide containing tungsten and indium, an oxide containing tungsten and indium and zinc, an oxide containing titanium and indium, an oxide containing titanium and indium and tin, an oxide containing indium and zinc, an oxide containing silicon and indium and tin, or an oxide containing indium or gallium and zinc. The metal oxide layer may be a single layer, or may be a double-layer, or may be a multi-layer. An active layer thin film may be made of an amorphous Indium Gallium Zinc Oxide material (a-IGZO), Zinc OxyNitride (ZnON), Indium Zinc Tin Oxide (IZTO), amorphous Silicon (a-Si), polycrystalline Silicon (p-Si), hexathiophene, polythiophene, and other materials, that is, the present disclosure is applicable to transistors manufactured based on an oxide technology, a silicon technology, and an organic matter technology.

In an exemplary embodiment, the first insulation layer, the second insulation layer, the third insulation layer, the fourth insulation layer, and the fifth insulation layer may be made of any one or more of Silicon Oxide (SiOx), Silicon Nitride (SiNx), and Silicon OxyNitride (SiON), and may be a single-layer, a multi-layer, or a composite layer.

In an exemplary embodiment, the first conductive thin film to the fifth conductive thin film may be made of a metal material, such as any one or more of Argentum (Ag), Copper (Cu), Aluminum (Al), Titanium (Ti), and Molybdenum (Mo), or an alloy material of the abovementioned metals, such as an Aluminum-Neodymium alloy (AlNd) or a Molybdenum-Niobium alloy (MoNb), and may be of a single layer structure, or a multi-layer composite structure such as Ti/Al/Ti.

In an exemplary embodiment, the planarization layer may be made of an organic material.

The display substrate according to the embodiment of the present disclosure may be applied to display products with any resolution.

An embodiment of the present disclosure further provides a display apparatus, including a display substrate.

In an exemplary embodiment, the display apparatus may be any product or component with any display function, such as a display, a television, a mobile phone, a tablet computer, a navigator, a digital photo frame, and a wearable display product.

The display substrate is the display substrate according to any of the aforementioned embodiments, and has similar implementation principles and implementation effects, which will not be repeated here.

The accompanying drawings in the present disclosure only involve structures involved in the embodiments of the present disclosure, and other structures may refer to usual designs.

For the sake of clarity, in accompanying drawings used for describing the embodiments of the present disclosure, a thickness and a dimension of a layer or a micro structure is enlarged. It may be understood that when an element such as a layer, a film, a region, or a substrate is described as being located "on" or "under" another element, the element may be "directly" located "on" or "under" the another element, or there may be an intermediate element.

Although the implementation modes disclosed in the present disclosure are as above, the described contents are only implementation modes used for convenience of understanding the present disclosure and are not intended to limit the present disclosure. Any person skilled in the art to which the present disclosure pertains may make any modification and variation in a form and details of implementation without departing from the spirit and scope disclosed in the present disclosure. However, the scope of patent protection of the present disclosure is still subject to the scope defined by appended claims.

The invention claimed is:

1. A display substrate, comprising a display region and a non-display region, the display region comprises at least one rounded corner, the non-display region comprises a rounded corner region located on an outside of the rounded corner, the display substrate comprises a base substrate and a circuit structure layer disposed on the base substrate, the circuit structure layer comprises pixel circuits arranged in an array and located in the display region and a control drive circuit located in the non-display region, a pixel circuit comprises a reset transistor, the control drive circuit is configured to provide a drive signal to the reset transistor;

the circuit structure layer further comprises a plurality of reset output lines and a plurality of reset transfer lines located in the non-display region and disposed on a side of the control drive circuit close to the display region, a reset output line is disposed in a different layer from a reset transfer line, an extension direction of the reset output line and an extension direction of the reset transfer line intersect;

the reset output line is electrically connected with the control drive circuit and the reset transfer line, respectively, the reset transfer line is connected with the pixel circuit; and an orthographic projection of at least one reset transfer line located in the rounded corner region on the base substrate is partially overlapped with an orthographic projection of the plurality of reset output lines on the base substrate;

wherein the circuit structure layer further comprises a reset connection line located in the non-display region and disposed on a side of the control drive circuit close to the display region, the reset connection line is disposed in a different layer from the reset output line, an extension direction of the reset connection line and an extension direction of the reset output line intersect, the pixel circuits arranged in the array comprise a plurality of reset signal lines;

the reset connection line is electrically connected with the reset transfer line and a reset signal line, respectively; and at least one reset connection line located in the rounded corner region is partially overlapped with orthographic projections of the plurality of reset output lines on the base substrate.

2. The display substrate according to claim 1, wherein the pixel circuit further comprises a writing transistor, the control drive circuit is further configured to provide a drive signal to the writing transistor; the circuit structure layer further comprises a plurality of control output lines located in the non-display region and disposed on a side of the control drive circuit close to the display region, a control output line is disposed in a different layer from the reset output line, an extension direction of the control output line and an extension direction of the reset output line intersect; the control output line is connected with the control drive circuit and the pixel circuit respectively, and an orthographic projection of the control output line on the base substrate is partially overlapped with the orthographic projections of the plurality of reset output lines on the base substrate.

3. The display substrate according to claim 2, wherein the circuit structure layer further comprises a control connection line located in the non-display region and disposed on a side of the control drive circuit close to the display region, the control connection line is disposed in a different layer from the reset output line, an extension direction of the control connection line and an extension direction of the reset output line intersect; the pixel circuits arranged in the array comprise a plurality of control signal lines; a control electrode of the writing transistor is electrically connected with a control signal line;

the control connection line is electrically connected with the control output line and the control signal line, respectively; and at least one control connection line located in the rounded corner region is partially overlapped with the orthographic projections of the plurality of reset output lines on the base substrate.

4. The display substrate according to claim 2, wherein the control drive circuit comprises a plurality of cascaded control shift registers, a control shift register comprises an output terminal;

an output terminal of an i-th stage control shift register is electrically connected with an i-th reset output line, $1 \leq i \leq M$, and an output terminal of a j-th stage control shift register is electrically connected with a (j-S)-th control output line, $S+1 \leq j \leq M+S$, M is a total number of rows of pixel circuits, $S \geq 1$; and a reset output line and a control output line that are connected with an output terminal of a same control shift register are interconnected, and an orthographic projection of the reset output line on the base substrate is partially overlapped with an orthographic projection of the control output line on the base substrate.

5. The display substrate according to claim 4, wherein the circuit structure layer further comprises a light emitting drive circuit located in the non-display region, the light emitting drive circuit is located on a side of the control drive circuit away from the display region, the pixel circuit comprises a light emitting transistor, the light emitting drive circuit is configured to provide a drive signal to the light emitting transistor;

the circuit structure layer further comprises a plurality of light emitting output lines located in the non-display region and disposed on a side of the control drive circuit close to the display region, a light emitting output line is disposed in a different layer from the reset output line, an extension direction of the light emitting output line and an extension direction of the reset output line intersect;

the light emitting output line is connected with the light emitting drive circuit and the pixel circuit respectively, and an orthographic projection of the light emitting output line on the base substrate is partially overlapped with the orthographic projections of the plurality of reset output lines on the base substrate.

6. The display substrate according to claim 5, wherein the circuit structure layer further comprises a light emitting connection line located in the non-display region and disposed on a side of the control drive circuit close to the display region, the light emitting connection line is disposed in a different layer from the reset output line, an extension direction of the light emitting connection line and an extension direction of the reset output line intersect, the pixel circuits arranged in the array comprise a plurality of light emitting signal lines;

the light emitting connection line is electrically connected with the light emitting output line and a light emitting signal line, respectively; and at least one light emitting connection line located in the rounded corner region is partially overlapped with the orthographic projections of the plurality of reset output lines on the base substrate.

7. The display substrate according to claim 6, wherein the light emitting drive circuit comprises a plurality of cascaded light emitting shift registers, a light emitting shift register comprises an output terminal; and an output terminal of at least one stage light emitting shift register is electrically connected with a plurality of light emitting output lines.

8. The display substrate according to claim 5, wherein when a light emitting shift register is electrically connected with at least two light emitting output lines, the circuit structure layer further comprises a light emitting connection part located in the non-display region and disposed on a side of the control drive circuit close to the display region; the light emitting connection part is disposed in a different layer from a light emitting output line, an extension direction of the light emitting connection part and an extension direction of the light emitting output line intersect;

at least two light emitting output lines connected with a same light emitting shift register are electrically connected through the light connection part, and the light connection part is located on a side of the plurality of reset output lines away from the display region.

9. The display substrate according to claim 8, wherein the circuit structure layer further comprises a scan drive circuit located in the non-display region, the scan drive circuit is located between the control drive circuit and the light emitting drive circuit, the pixel circuit comprises a compensation transistor, the scan drive circuit is configured to provide a drive signal to the compensation transistor;

the circuit structure layer further comprises a plurality of scan output lines located in the non-display region and disposed on a side of the control drive circuit close to the display region, a scan output line is disposed in a different layer from the reset output line, an extension direction of the scan output line and an extension direction of the reset output line intersect;

the scan output line is connected with the scan drive circuit and the pixel circuit respectively, and an orthographic projection of the scan output line on the base substrate is partially overlapped with the orthographic projections of the plurality of reset output lines on the base substrate.

10. The display substrate according to claim 9, wherein the circuit structure layer further comprises a scan connection line located in the non-display region and disposed on a side of the control drive circuit close to the display region, the scan connection line is disposed in a different layer from the reset output line, an extension direction of the scan connection line and an extension direction of the reset output line intersect; the pixel circuits arranged in the array comprise a plurality of scan signal lines;

the scan connection line is electrically connected with the scan output line and a scan signal line, respectively; and at least one scan connection line located in the rounded corner region is partially overlapped with the orthographic projections of the plurality of reset output lines on the base substrate.

11. The display substrate according to claim 10, wherein the scan drive circuit comprises a plurality of cascaded scan shift registers, a scan shift register comprises an output terminal; and an output terminal of at least one stage scan shift register is electrically connected with a plurality of scan output lines.

12. The display substrate according to claim 9, wherein when a scan shift register is electrically connected with at least two scan output lines, the circuit structure layer further comprises a scan connection part located in the non-display region and disposed on a side of the control drive circuit close to the display region; the scan connection part is disposed in a different layer from a scan output line, an extension direction of the scan connection part and an extension direction of the scan output line intersect; and at least two scan output lines connected with a same scan shift register are electrically connected through the scan connection part, and the scan connection part is located on a side of the plurality of reset output lines away from the display region.

13. The display substrate according to claim 12, wherein the circuit structure layer further comprises a plurality of first initial output lines located in the non-display region and disposed on a side of the control drive circuit close to the display region, a first initial output line is disposed in a different layer from the reset output line, an extension direction of the first initial output line and an extension direction of the reset output line intersect; the pixel circuits arranged in the array comprises a plurality of first initial signal lines and a plurality of second initial signal lines; and the first initial output line is electrically connected with one signal line of a first initial signal line and a second initial signal line of a pixel circuit, and an orthographic projection of the first initial output line on the base substrate is partially overlapped with the orthographic projections of the plurality of reset output lines on the base substrate.

14. The display substrate according to claim 13, wherein the circuit structure layer further comprises a plurality of first initial connection lines located in the non-display region and disposed on a side of the control drive circuit close to the display region, a first initial connection line is disposed in a different layer from the reset output line, an extension direction of the first initial connection line and an extension direction of the reset output line intersect;
the first initial output line is electrically connected with one signal line of the first initial signal line and the second initial signal line of the pixel circuit through the first initial connection line; and
an orthographic projection of the first initial connection line located in the rounded corner region on the base substrate is partially overlapped with the orthographic projections of the plurality of reset output lines on the base substrate.

15. The display substrate according to claim 14, wherein the circuit structure layer further comprises a first initial power supply line located in the non-display region and disposed on a side of the control drive circuit close to the display region, the first initial power supply line is disposed in a different layer from the reset output line, an extension direction of the first initial power supply line and an extension direction of the reset output line are parallel; and
the first initial power supply line is electrically connected with the plurality of first initial output lines, and an orthographic projection of the first initial power supply line on the base substrate is at least partially overlapped with the orthographic projections of the plurality of reset output lines on the base substrate.

16. The display substrate according to claim 15, wherein the circuit structure layer further comprises a plurality of second initial connection lines located in the non-display region and disposed on a side of the control drive circuit close to the display region, a second initial connection line is disposed in a different layer from the reset output line, an extension direction of the second initial connection line and an extension direction of the reset output line intersect, an extension direction of the first initial connection line and an extension direction of the second initial connection line are parallel; and
the second initial connection line is electrically connected with the other signal line of the first initial signal line and the second initial signal line of the pixel circuit, and an orthographic projection of the second initial connection line on the base substrate is partially overlapped with the orthographic projections of the plurality of reset output lines on the base substrate.

17. The display substrate according to claim 16, wherein the circuit structure layer further comprises a second initial power supply line located in the non-display region and disposed on a side of the control drive circuit close to the display region, the second initial power supply line is disposed in a different layer from the reset output line and is disposed in a same layer as the second initial connection line, an extension direction of the first initial power supply line and an extension direction of the second initial power supply line are parallel, and the second initial power supply line is located on a side of the first initial power supply line close to the display region; and
the second initial power supply line is electrically connected with the plurality of second initial connection lines, and an orthographic projection of the second initial power supply line on the base substrate is at least partially overlapped with the orthographic projections of the plurality of reset output lines on the base substrate.

18. The display substrate according to claim 17, wherein the circuit structure layer comprises a semiconductor layer, a first insulation layer, a first conductive layer, a second insulation layer, a second conductive layer, a third insulation layer, a third conductive layer, a fourth insulation layer, a fourth conductive layer, a fifth insulation layer, and a fifth conductive layer stacked sequentially on the base substrate;
the first conductive layer comprises a reset signal line, a light emitting signal line, a scan signal line, and a control signal line;
the second conductive layer comprises a first initial signal line, a second initial signal line, and a scan connection part;
the third conductive layer comprises a light emitting connection part;
the fourth conductive layer comprises a reset transfer line, a first initial output line, a light emitting output line, a scan output line, and a control output line; and
the fifth conductive layer comprises a reset connection line, a first initial connection line, a light emitting connection line, a scan connection line, a control connection line, a second initial connection line, a first initial power supply line, and a second initial power supply line.

19. A display apparatus, comprising a display substrate according to claim 1.

* * * * *